(12) United States Patent
Isaacson et al.

(10) Patent No.: US 7,682,952 B2
(45) Date of Patent: Mar. 23, 2010

(54) METHOD FOR FORMING LOW DEFECT DENSITY ALLOY GRADED LAYERS AND STRUCTURE CONTAINING SUCH LAYERS

(75) Inventors: David Michael Isaacson, Boston, MA (US); Eugene A. Fitzgerald, Windham, NH (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 10/999,486

(22) Filed: Nov. 30, 2004

(65) Prior Publication Data
US 2006/0113542 A1 Jun. 1, 2006

(51) Int. Cl.
H01L 21/20 (2006.01)

(52) U.S. Cl. .................. 438/493; 438/497; 438/500; 438/503; 438/507; 438/933; 438/938

(58) Field of Classification Search ................ 438/87, 438/933, 938, 497, 500, 503, 507, 493
See application file for complete search history.

(56) References Cited

U.S. PATENT DOCUMENTS

| | | | |
|---|---|---|---|
| 5,221,413 A | 6/1993 | Brasen et al. | |
| 5,442,205 A | 8/1995 | Brasen et al. | |
| 5,810,924 A | 9/1998 | Legoues et al. | |
| 6,039,803 A | 3/2000 | Fitzgerald et al. | |
| 6,107,653 A | 8/2000 | Fitzgerald et al. | |
| 6,291,321 B1 | 9/2001 | Fitzgerald | |
| 6,503,773 B2 | 1/2003 | Fitzgerald | |
| 6,518,644 B2 | 2/2003 | Fitzgerald | |
| 6,723,622 B2 | 4/2004 | Murthy et al. | |
| 2004/0087117 A1 | 5/2004 | Leitz et al. | |

FOREIGN PATENT DOCUMENTS

WO  WO 98/59365 A1  12/1998
WO  WO 03/103031 A2  12/2003

OTHER PUBLICATIONS

Written Opinion and International Search Report for PCT/US2005/042865, dated Jul. 13, 2006.
Kanel et al., Very high hole mobilities in modulation-doped Ge quantum wells grown by low-energy plasma enchanced chemical vapor despositoin, Applied Physics Letters, AIP, vol. 80, No. 16, pp. 2922-2924, 2002.

(Continued)

*Primary Examiner*—Matthew C Landau
*Assistant Examiner*—Candice Y Chan
(74) *Attorney, Agent, or Firm*—Wolf, Greenfield & Sacks, P.C.

(57) ABSTRACT

A structure and method of forming same, comprising a low threading density alloy graded layer, deposited according to a deposition temperature profile in correspondence with increasing alloy composition. In one embodiment, a first substantially relaxed alloy graded layer is deposited while varying a deposition temperature according to a first temperature profile. A second substantially relaxed alloy graded layer is deposited over the first graded layer while varying a deposition temperature according to a second temperature profile. Preferably, the minimum signed rate of change of the second temperature profile is less than the maximum signed rate of change of the first temperature profile.

17 Claims, 20 Drawing Sheets

OTHER PUBLICATIONS

Currie et al., Controlling threading dislocation densities in Ge on Si using graded SiGe layers and chemical-mechanical polishing, Applied Physics Letters, vol. 72, No. 14, 1998, p. 1718-1720.

Fitzgerald et al., Dislocation dynamics in relaxed graded composition semiconductors, Materials Science and Engineering B67: Elsevier Science S.A., 1999, p. 53-61.

Fitzgerald et al., Totally relaxed $Ge_xSi_{1-x}$ layers with low threading dislocation densities grown on Si substrates, Applied Physics Letters: American Institute of Physics, vol. 59, No. 7, 1991, p. 811-813.

Leitz et al., Dislocation glide and blocking kinetics in compositionally graded SiGe/Si, Journal of Applied Physics: American Institute of Physics, vol. 90, No. 6, 2001, pp. 2730-2736.

Liu et al., High-quality Ge films on Si substrates using Sb sufractant-mediated graded SiGe buffers, Applied Physics Letters: American Institute of Physics, vol. 79, No. 21, 2001, pp. 3431-3433.

Yonenaga, Growth and mechanical properties of GeSi bulk crystals, Journal of Materials Science: Materials in Electronics, vol. 10, 1999, pp. 329-333.

METHOD FOR FORMING LOW DEFECT DENSITY ALLOY GRADED LAYERS AND STRUCTURE CONTAINING SUCH LAYERS

This invention was made with government support under Grant Number DAAD19-01-0588, awarded by the Army. The government has certain rights in the invention.

FIELD OF INVENTION

The invention relates to a method for making a low threading dislocation density alloy graded layer on a substrate and to structures having such graded layers on a substrate. Such a method is particularly useful for forming semiconductor alloy graded layers, for example silicon germanium, indium gallium arsenide, and indium gallium phosphide graded layers.

BACKGROUND OF THE INVENTION

The integration of lattice-mismatched layers on conventional substrates enables the fabrication of numerous electronic and optoelectronic devices on standard substrates. An obstacle in the integration of such materials onto conventional substrates, such as bulk silicon, is the lattice mismatch between the deposited layers and the underlying conventional substrate. Lattice mismatch implies that the equilibrium lattice constant of the material being deposited differs from the lattice constant of the substrate, leading to the creation of defects to accommodate the mismatch. Examples of such defects include misfit dislocation segments along the interface of the deposited lattice-mismatched layer and the substrate, in addition to threading dislocation segments, connected to the ends of the misfit segments and terminating at the surface of the lattice-mismatched layer. The presence of these threading dislocations in device layers may degrade device performance and complicate processing; hence the minimization of threading dislocation densities in lattice-mismatched layers is of importance in the fabrication of electronic and optoelectronic devices.

A number of techniques have been employed to reduce threading dislocation densities in lattice-mismatched layers. A common technique includes the deposition of an alloy graded layer on the substrate, wherein the content of the alloy is gradually increased so as to suppress the nucleation of large numbers of threading dislocations. For example, in the case of silicon germanium on silicon substrates, a silicon germanium graded layer may be deposited on the substrate, wherein the germanium content of the silicon germanium alloy is gradually increased up to a final germanium content desired for the application. The end result is a relaxed (i.e., unstrained) alloy graded layer, possessing an equilibrium lattice constant differing from the substrate lattice constant, wherein the threading dislocation density at the surface of the graded layer is several orders of magnitude lower than if a uniform composition alloy layer, possessing the final alloy composition, had been directly deposited onto the substrate.

BRIEF SUMMARY OF THE INVENTION

In some embodiments, a method of forming a semiconductor structure, comprising depositing a first substantially relaxed alloy graded layer of constituents A and B, the depositing step including increasing the B content along a deposition direction of the first graded layer from an initial B content to an intermediate B content, while depositing the first graded layer, varying a deposition temperature according to a first temperature profile, depositing a second substantially relaxed alloy graded layer of constituents A and B over the first graded layer, the depositing step including increasing the B content along a deposition direction of the second graded layer from a B content greater than the intermediate B content to a final B content, while depositing the second graded layer, varying a deposition temperature according to a second temperature profile, wherein the minimum signed rate of change of the second temperature profile is less that the maximum signed rate of change of the first temperature profile, wherein the signed rates of change are defined in correspondence with the increasing B content, and whereby the second graded layer possesses a low threading dislocation density.

In further embodiments, a method of forming a semiconductor structure, comprising depositing a first substantially relaxed alloy graded layer of constituents A and B, the depositing step including increasing the B content along a deposition direction of the first graded layer from an initial B content to an intermediate B content, after depositing the first graded layer, abruptly varying a deposition temperature, depositing a second substantially relaxed alloy graded layer of constituents A and B over the first graded layer, the depositing step including increasing the B content along a deposition direction of the second graded layer from a B content greater than the intermediate B content to a final B content, and wherein the intermediate B content is greater than about 80% by composition.

In some embodiments, a method of forming a semiconductor structure, comprising depositing a first substantially relaxed alloy graded layer of constituents A and B, the depositing step including increasing the B content along a deposition direction of the first graded layer from an initial B content to an intermediate B content, after depositing the first graded layer, abruptly varying a deposition temperature, depositing a second substantially relaxed alloy graded layer of constituents A and B over the first graded layer, the depositing step including increasing the B content along a deposition direction of the second graded layer from a B content greater than the intermediate B content to a final B content, and wherein the intermediate B content is less than about 20% by composition.

In various embodiments, a method of forming a semiconductor structure, comprising depositing a first structure over a substrate, at temperatures greater than about 700° C., wherein the first structure comprises one or more substantially relaxed silicon germanium layers, and depositing a second structure over the first structure, at temperatures less than about 700° C., wherein the second structure comprises one or more substantially relaxed silicon germanium layers having a germanium contents greater than about 92% by composition.

In some embodiments, a semiconductor structure, comprising a substantially relaxed silicon germanium graded layer disposed over a substrate, wherein the substantially relaxed silicon germanium graded layer is not doped with antimony concentrations greater than about $10^{16}$ cm$^{-3}$, and wherein the surface of the substantially relaxed silicon germanium graded layer comprises a germanium content of about 96% by composition, and one or more substantially relaxed silicon germanium layers, with germanium contents greater than about 96% by composition, and a threading dislocation density less than about $1 \times 10^6$ cm$^{-2}$, disposed over the substantially relaxed silicon germanium graded layer.

In some embodiments, a method of forming a semiconductor structure, comprising depositing a substantially relaxed silicon germanium graded layer over a substrate, at temperatures greater than about 700° C., wherein the surface of the substantially relaxed silicon germanium graded layer comprises a germanium content greater than about 92% by composition, and depositing a strained germanium layer over the substantially relaxed silicon germanium graded layer, at temperatures less than about 700° C.

In various embodiments, a semiconductor structure, comprising a substantially relaxed silicon germanium graded layer disposed over a substrate, wherein the surface of the substantially relaxed silicon germanium graded layer comprises a germanium content greater than about 92% by composition, and a strained germanium layer disposed over the substantially relaxed silicon germanium graded layer.

BRIEF DESCRIPTION OF THE DRAWINGS

The accompanying drawings are not intended to be drawn to scale. In the drawings, an effort has been made to use a like identifier for each identical or nearly identical component that is illustrated in various figures; however, use of a different identifier does not necessarily indicate a different component. For purposes of clarity, not every component may be labeled in every drawing. In the drawings.

DETAILED DESCRIPTION OF THE INVENTION

Figure 1:
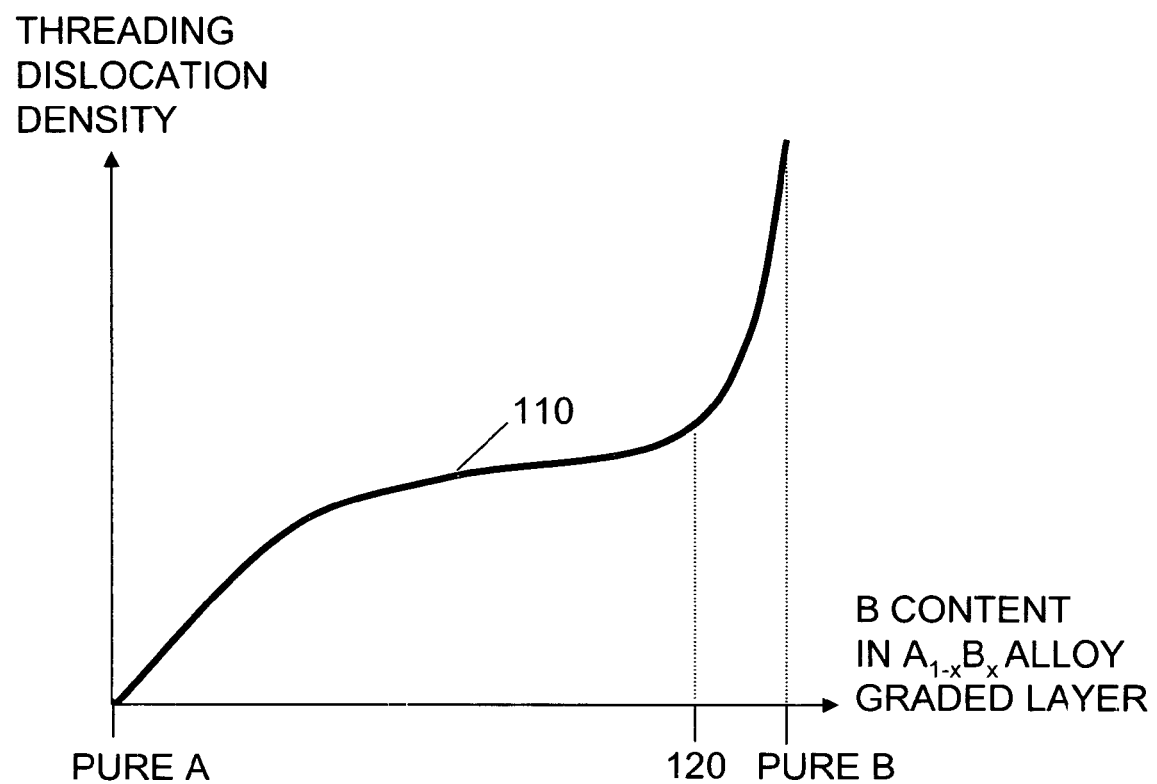
FIG. 1 is a graph of the threading dislocation density versus the alloy composition in an alloy graded layer deposited at a constant temperature.

This invention is not limited in its application to the details of construction and the arrangement of components set forth in the following description or illustrated in the drawings. The invention is capable of other embodiments and of being practiced or of being carried out in various ways. Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

In the past, some methods to further reduce threading dislocation density in alloy graded layers have called for undesirable modifications that impose undue limitations on the structure. For example, in the case of silicon germanium, one technique requires that the relaxed silicon germanium graded layer is doped with antimony concentrations greater than about $10^{16}$ cm$^{-3}$. Since such doping may be undesirable from a device perspective, we have recognized a need to allow for the optional elimination of such undue doping constraints, while still reducing threading dislocation densities. Therefore, although alloy graded layers are currently employed to reduce threading dislocation densities in lattice-mismatched layers, we have appreciated that a need exists to further minimize threading dislocation densities in alloy graded layers.

Embodiments presented provide methods and structures comprising low threading dislocation density alloy graded layers deposited on substrates. In some embodiments, an intermediate alloy content defines regions of varying deposition temperature. In some embodiments, a threading dislocation density in the alloy graded layer is minimized by a suitable choice of the intermediate content and the deposition temperature variation.

We have noted that the threading dislocation density for an A-B alloy graded layer, wherein constituents A and B represent chemical elements and/or compounds, deposited at a constant temperature, increases dramatically at a specific B content. We have also noted that this specific B content in the graded layer, at which the threading dislocation density increases dramatically, may depend upon the hardness or yield stress of the A-B alloy. As a result, escalations in the threading dislocation density in the A-B alloy graded layer may be prevented by suitably varying the temperature during the deposition of the A-B alloy graded layer, based partly on the hardness or yield stress of the deposited alloy.

FIG. 1 shows a graph of the threading dislocation density in an A-B alloy graded layer deposited at a constant temperature, wherein the A-B alloy may be represented by a chemical formula $A_{1-x}B_x$, with x being the B content by composition. The threading dislocation density 110 increases as the B content at the surface of the graded layer is increased from 0% to 100%, denoted by pure A and pure B. As the B content at the surface of the growing graded layer is increased, the threading dislocation density initially increases at a first rate, then slows its rate of increase, until a transition content 120 is attained, at which point the threading dislocation density increases substantially in the remaining portion of the graded layer. This behavior may be universal for all A-B alloy graded layers wherein the pure B hardness is smaller than the pure A hardness, which typically implies that the pure B relaxed lattice constant is greater than the pure A relaxed lattice constant.

It should be noted that in the terminology used herein, an alloy graded layer may refer to an alloy film wherein the alloy composition varies along the deposition direction. In some instances, an alloy graded layer may have a composition that varies continuously along the deposition direction. In addition, in further instances, an alloy graded layer may comprise a plurality of uniform alloy composition layers, potentially possessing differing alloy compositions, disposed over one another. Furthermore, an alloy graded layer may also comprise both one or more uniform alloy composition layers and portions possessing a continuously varying alloy composition along the deposition direction. Although these are possible examples of an alloy graded layer, it should be noted that the embodiments presented herein are not necessarily limited to merely these abovementioned examples, and may encompass any other structure recognized as an alloy graded layer by those skilled in the art.

In general, A-B alloys have a yield stress that varies with B content in the alloy, and since dislocation nucleation and kinetics depend on the yield stress and also the temperature, maintaining optimal dislocation nucleation and kinetics may benefit from varying the deposition temperature in accordance with the B content of the alloy being deposited in the graded layer. More specifically, since A-B alloys may have a yield stress that varies greatly at a specific B content, varying the deposition temperature in the proximity of that specific alloy composition may aid in reducing the threading dislocation density in A-B alloy graded layers.

Figure 2:
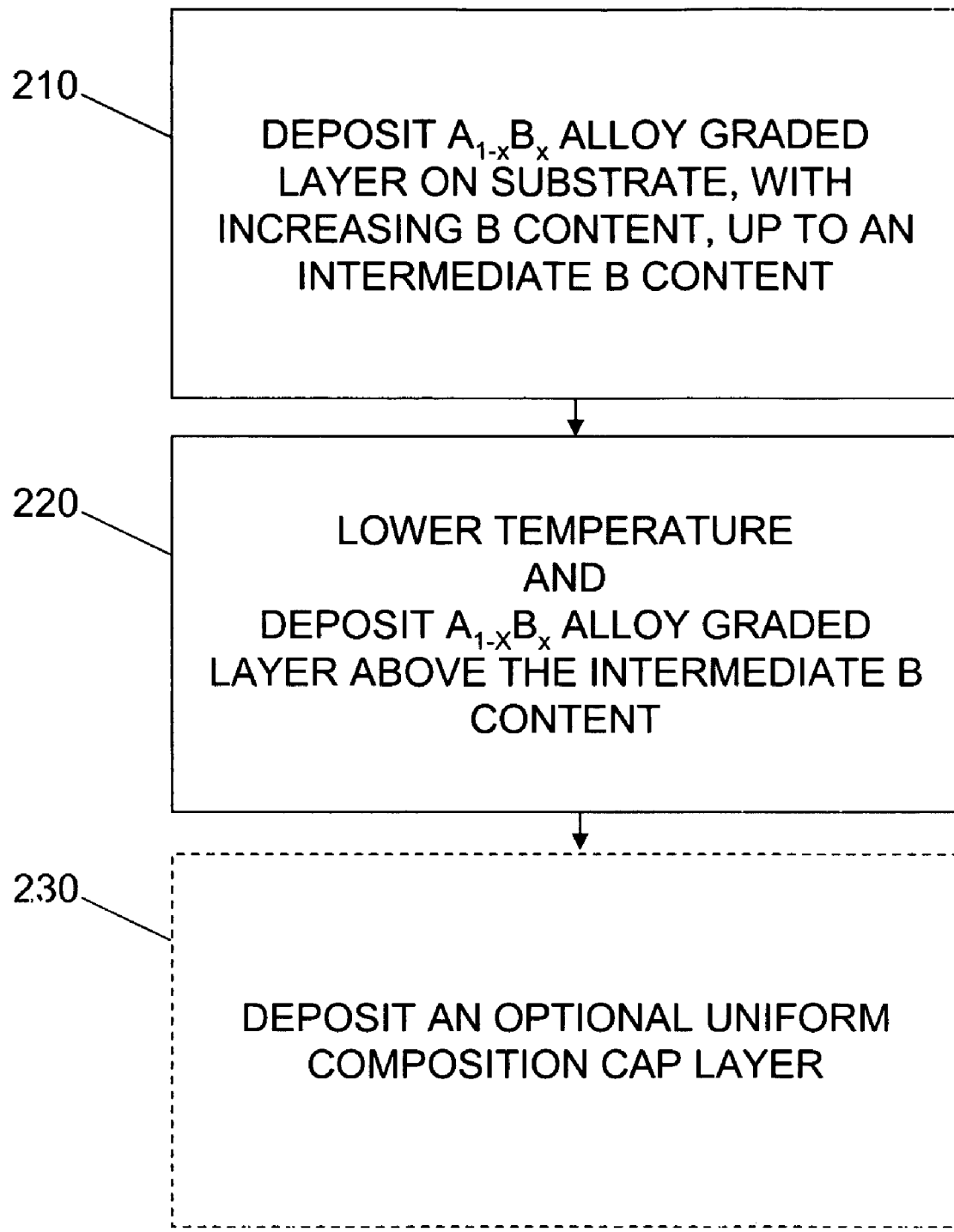
FIG. 2 is a flowchart illustrating a method for making alloy graded layers.

In one embodiment, illustrated in FIG. 2, an A-B alloy graded layer is deposited on a substrate, with an increasing B content up to an intermediate content, per step 210. The deposition temperature is then lowered, either abruptly or continuously, and the remainder of the A-B alloy graded layer, with B contents above the intermediate B content, is deposited, as noted in step 220. Next, an optional uniform composition A-B alloy cap layer or pure B cap layer may be deposited on the graded layer, per step 230. The deposition may be accomplished by any suitable epitaxial deposition technique including, but not limited to, atmospheric pressure chemical vapor deposition (AP-CVD), low pressure chemical vapor deposition (LP-CVD), ultra high vacuum chemical vapor deposition (UHV-CVD) or molecular beam epitaxy (MBE). In addition, the epitaxial growth system may be a single wafer or a multiple wafer reactor and may also utilize a low energy plasma to enhance the growth kinetics.

The A-B alloy may comprise any alloy possessing the desired properties for the device application, for example, the A-B alloy may possess specific mechanical, electronic, or optical properties suitable for the device application. Examples of A-B alloys comprising semiconductor materials include silicon germanium, indium gallium arsenide, and indium gallium phosphide, but the embodiments are by no means limited to these specific alloy systems.

In some examples of A-B alloy graded layers, the A constituent may comprise silicon, gallium arsenide or gallium phosphide, and respectfully, the B constituent comprises germanium, indium arsenide or indium phosphide. In the aforementioned examples, the A-B alloy graded layers are deposited so that the B content increases along the deposition direction of the graded layer. In particular, in the case of silicon germanium, the germanium content deposited on the surface of the growing graded layer increases during the deposition process. Such graded layers are sometimes referred to as compressive systems, since the relaxed lattice constant increases along the deposition direction of the graded layer.

Further examples of graded layers include so-called tensile systems, wherein the relaxed lattice constant decreases along the deposition direction of the graded layer. Examples of such A-B alloys include silicon germanium, indium gallium arsenide, and indium gallium phosphide, wherein the B constituent comprises silicon, gallium arsenide or gallium phosphide, and respectfully, the A constituent comprises germanium, indium arsenide or indium phosphide. In these examples, the A-B alloy graded layers are also deposited so that the B content increases along the deposition direction of the graded layer. For example, in the case of a tensile system comprising silicon germanium, the silicon content deposited on the surface of the growing graded layer increases during the deposition process.

Figure 3A:
FIG. 3A is a schematic illustration of a substrate for depositing alloy graded layers.
Figure 3B:
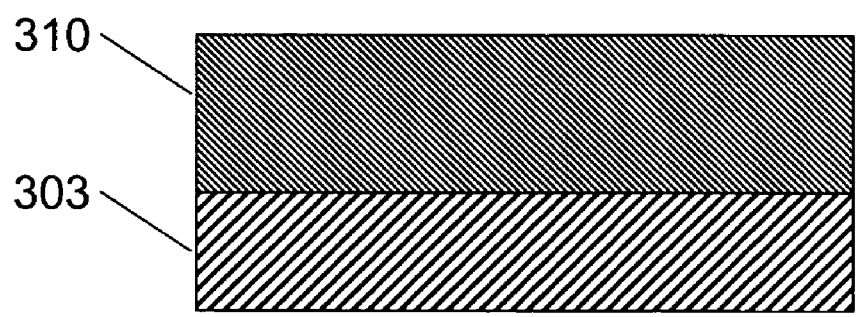
FIG. 3B is a schematic illustration of a first alloy graded layer disposed over the substrate in FIG. 3A.
Figure 3C:
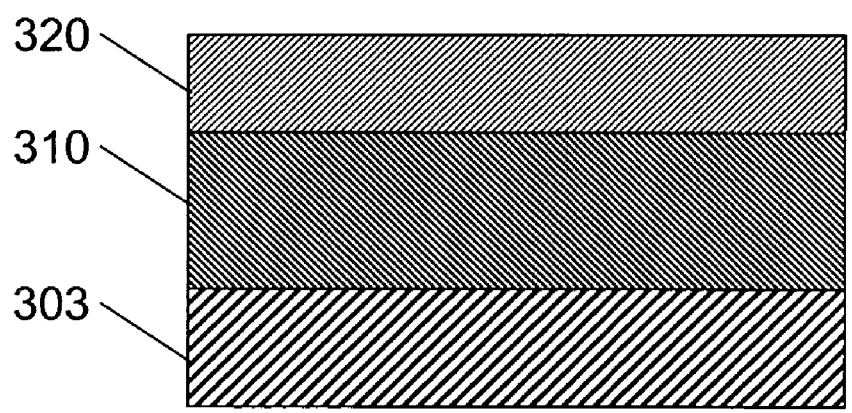
FIG. 3C is a schematic illustration of second alloy graded layer disposed over the structure in FIG. 3B.

FIGS. 3A-3C schematically illustrate an embodiment of a process. A substrate 303, as shown in FIG. 3A, is provided. The substrate 303 may comprise any material upon which layers may be deposited, and preferably comprises a semiconductor substrate. Examples of such substrates include bulk silicon, bulk germanium, bulk gallium arsenide, bulk indium phosphide, bulk gallium phosphide, in addition to any number of engineered substrates, such as semiconductor-on-insulator or semiconductor-on-semiconductor substrates. Examples of semiconductor-on-insulator substrates include silicon-on-insulator, silicon germanium on-insulator, germanium-on-insulator, strained silicon-on-insulator and strained germanium-on-insulator. Examples of semiconductor-on-semiconductor substrates include strained silicon-on-silicon, silicon germanium-on-silicon and germanium-on-silicon. Additionally, the substrate 303 may comprise an on-cut or off-cut substrate. On-cut substrates possess a surface crystallographic orientation of [100], wherein the crystal is oriented such that the surface normal is along a [100] crystallographic direction. Off-cut substrates possess a surface crystallographic orientation such that the surface normal is not along a [100] crystal direction. For off-cut substrates, the crystallographic orientation may be such that the surface normal of the substrate and the nearest [100] direction are separated by an offset angle θ. For example, in some embodiments, the substrate may possess an off-cut angle greater than 0° and less than about 8°, preferably less than about 4°. We have appreciated that off-cut substrates may be beneficial in reducing anti-phase boundaries when depositing III-V semiconductors on graded alloy layers, but off-cut substrates may increase threading dislocation densities in the graded alloy layers (depending on whether the deposition method is glide dominated). Based on this observation, we have recognized that in some embodiments, it may be beneficial to use off-cut substrates possessing a low off-cut angle, for example an off-cut angle less than about 4°, preferably about 2°.

FIG. 3B shows a first step of the illustrated process, wherein an A-B alloy graded layer 310 is deposited over the substrate 303. The A-B alloy graded layer 310 is such that the B content in the graded layer increases along the deposition direction, from an initial content, typically 0% B, to an intermediate B content. The intermediate B content may be chosen to correspond to any given alloy composition. Specifically, the intermediate B content may be selected so as to minimize threading dislocation density in the graded layer. For example, the intermediate B content may be chosen to be the transition content 120, as described in the description of FIG. 1.

The temperature is then lowered, either abruptly or continuously, and, as illustrated in FIG. 3C, a second A-B alloy graded layer 320 is deposited over the first A-B alloy graded layer 310. The second A-B alloy graded layer 320 is deposited such that the B content along the deposition direction increases from a content greater than or equal to the intermediate B content to a final B content, possibly 100% B.

Figure 4:
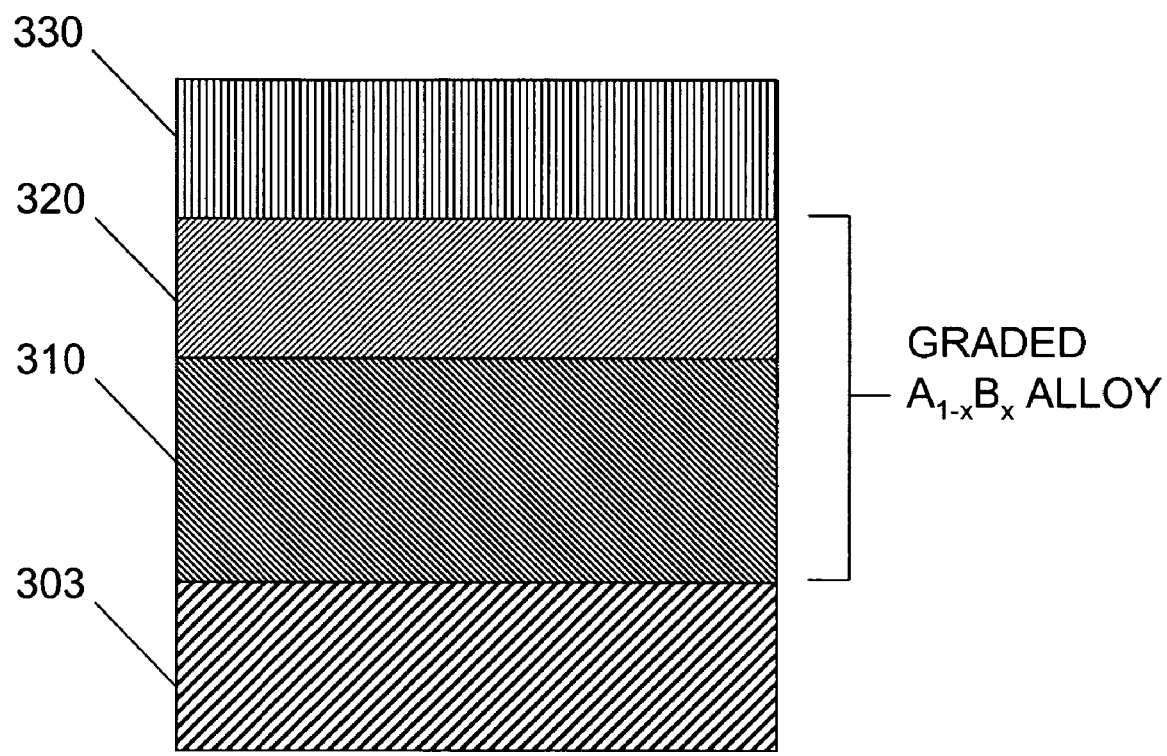
FIG. 4 is a schematic illustration of uniform composition alloy layer disposed over a first and second alloy graded layer.

In some embodiments, an optional uniform composition cap layer, comprising a uniform B content A-B alloy layer, or a pure B layer is deposited over the structure presented in FIG. 3C. The resulting structure, as shown in FIG. 4, comprises a first A-B alloy graded layer 310 deposited over a substrate 303, wherein the first A-B alloy graded layer 310 possesses an increasing B content up to an intermediate B content. The deposition temperature is then lowered and a second A-B alloy graded layer 320 is deposited over the first A-B alloy graded layer 310, wherein the second A-B alloy graded layer possesses an increasing B content greater than the intermediate B content up to a final B content. Next, a uniform composition cap layer 330 is deposited over the A-B alloy graded layer 320, wherein the uniform composition cap layer 330 possesses a uniform B content throughout the entire layer.

Figure 5:
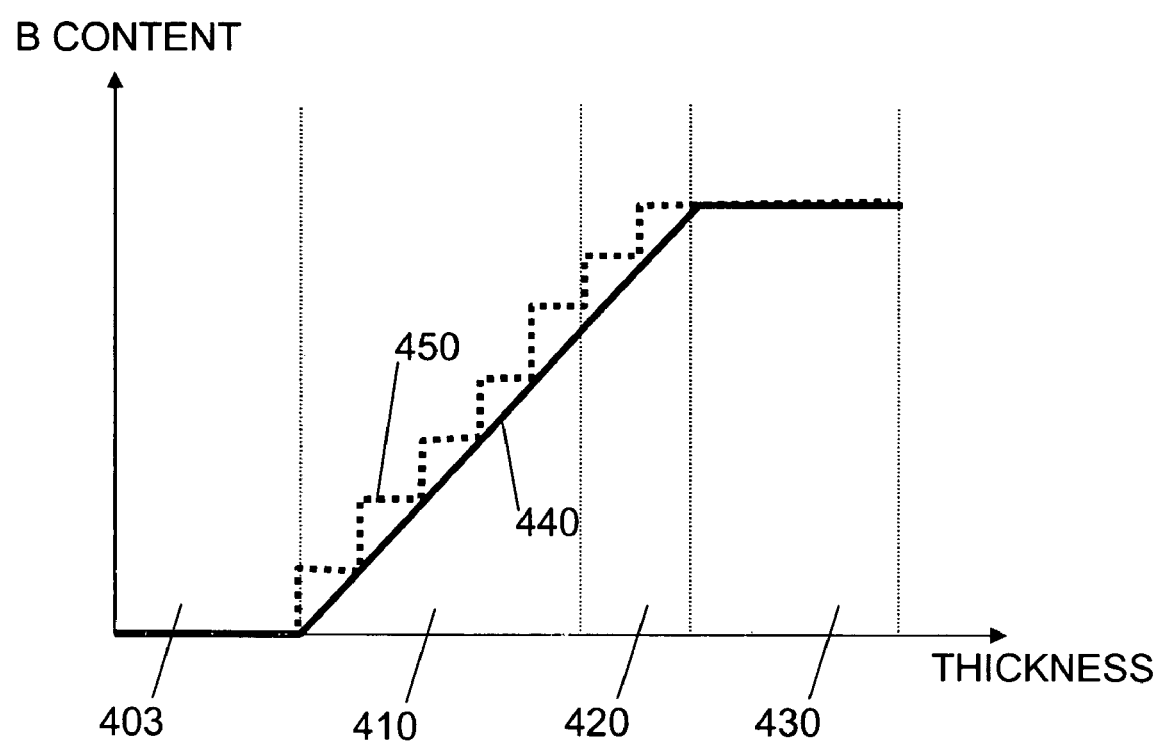
FIG. 5 is a graph of the B content of an A-B alloy graded layer in different layers of the structure in FIG. 4, plotted versus a schematic representation of the structure's cross-sectional view.

FIG. 5 illustrates an example of the B content as a function of thickness in the A-B alloy graded layer presented in FIG. 4. The B content, as a function of thickness in the deposited A-B alloy graded layer, is given by B content profile 440, showing the B content increasing linearly from the interface with the substrate 403. The B content increases throughout the first graded layer 410 and the second graded layer 420, up to the uniform composition cap layer 430. In further embodiments, the B content may be increased in a step-wise fashion as shown by curve 450. In some embodiments, the B content may increase according to any monotonically increasing function, for example, parabolic, quadratic or exponential variation as a function of the thickness of the A-B alloy graded layer.

Figure 6:
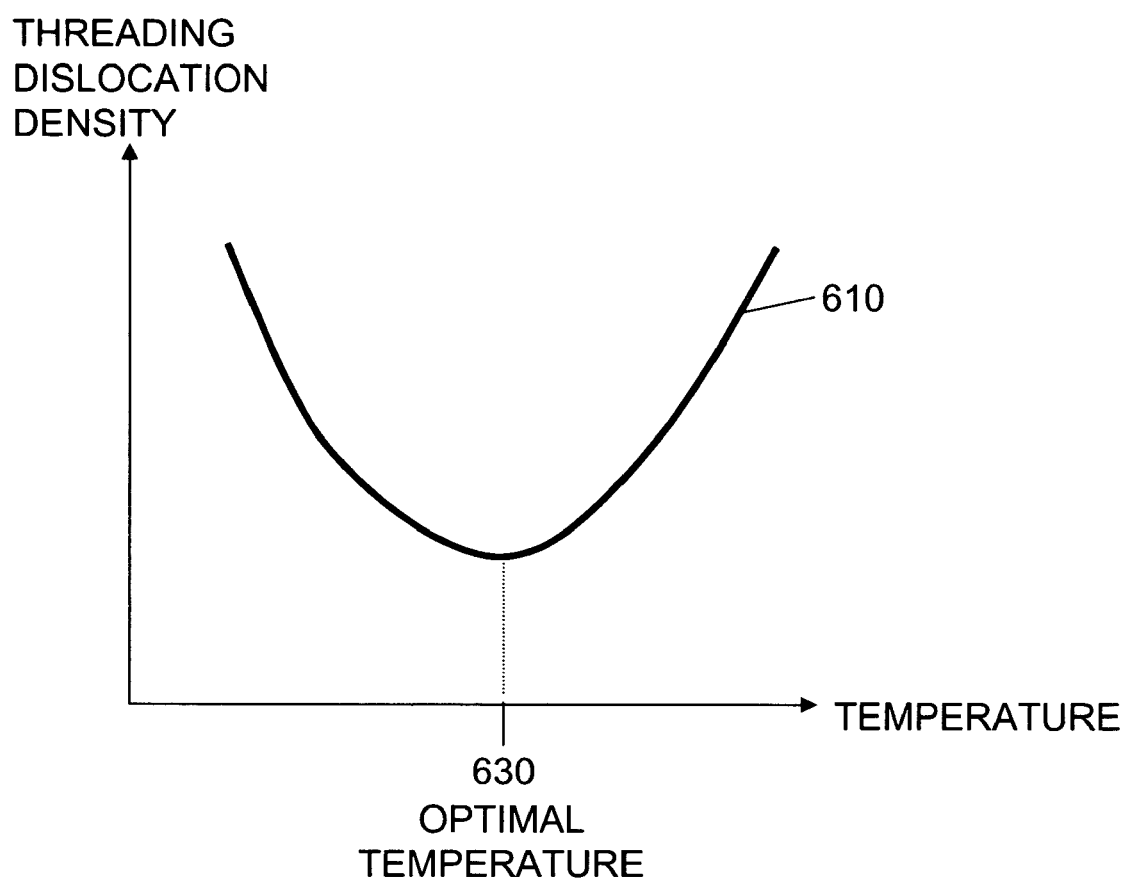
FIG. 6 is a graph of the threading dislocation density in an alloy layer possessing a given alloy composition, plotted versus deposition temperature.

We have found that there exists an optimal deposition temperature that minimizes the threading dislocation density of an A-B alloy possessing a given B content deposited onto a lattice-mismatched interface. As shown in FIG. 6, an optimal deposition temperature 630 allows for a minimization of the threading dislocation density 610 for an A-B alloy layer possessing a uniform B content. The optimal temperature 630 may be determined by the balance between various dislocation nucleation and glide (i.e., motion along the interface) factors. For example, for temperatures below the optimal temperature 630, the threading dislocation may increase due to reduced dislocation glide which incurs the nucleation of additional dislocations to relax the deposited layer. In contrast, for temperatures above the optimal temperature 630, dislocation glide may be sufficiently fast to relax the layer without requiring additional dislocations, but the elevated temperature may more easily nucleate dislocations in soft alloy layers (i.e., low yield stress). Since the yield stress of an alloy varies with composition, the optimal temperature depends on the B content in the A-B alloy; hence, to minimize the threading density in an A-B alloy graded layer, it is desirable to vary the temperature as the deposition process progresses. Moreover, it may be desirable to vary the deposition temperature according to the variation in yield stress or hardness of the deposited alloy.

Figure 7:
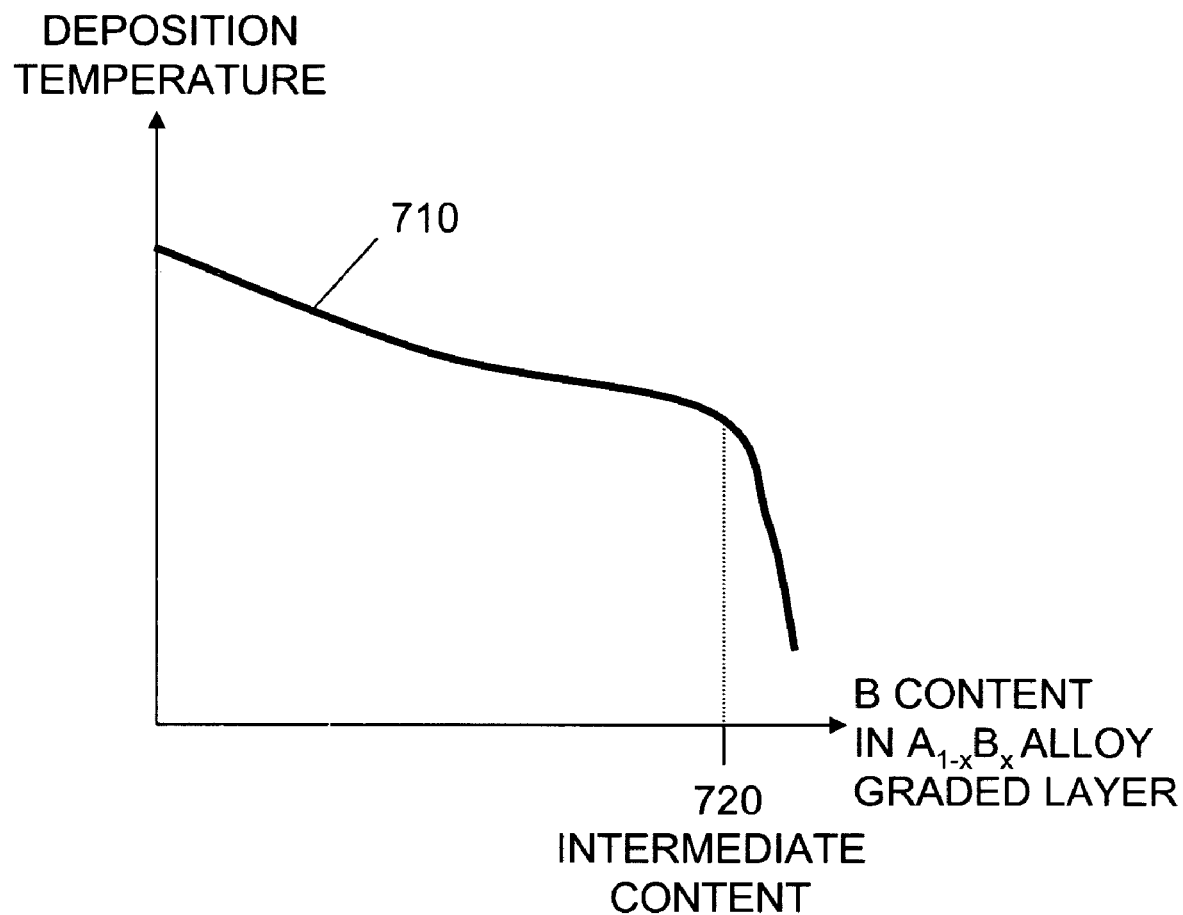
FIG. 7 is a graph of a decreasing deposition temperature profile versus alloy composition in an alloy graded layer.

In some embodiments, the deposition temperature for an A-B alloy graded layer is varied according to a temperature profile 710, as shown in FIG. 7. The deposition temperature 710 is decreased with respect to the B content in the A-B alloy graded layer, up to an intermediate content 720. Beyond the intermediate content 720, the deposition temperature 710 is decreased at faster rates. In some embodiments, the intermediate content 720 and the rates of decrease may be chosen so as to minimize the final threading dislocation density in the A-B alloy graded layer. In cases where the pure B material is softer than the pure A material, as is typically the case when the pure B constituent has a larger lattice constant than the pure A constituent, the intermediate content is usually greater than about 80% B, preferably about 95% B.

Figure 8:
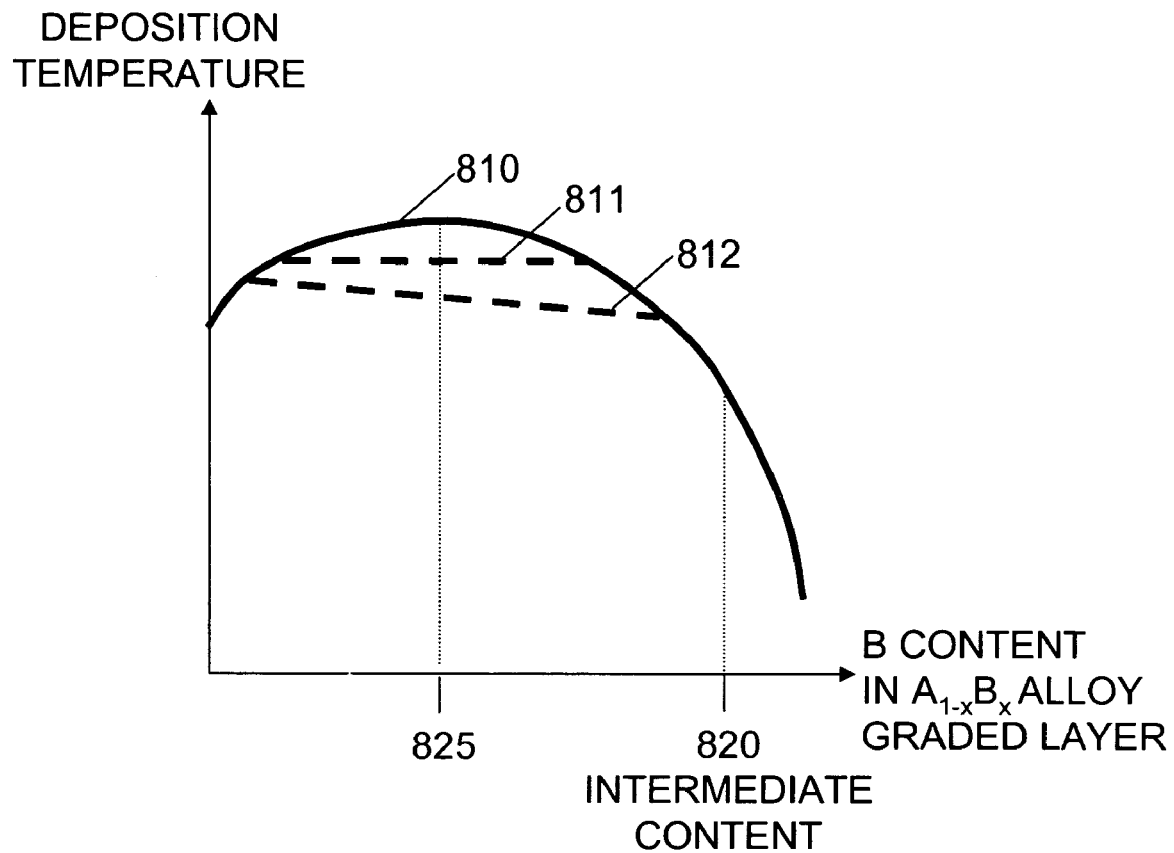
FIG. 8 is a graph of another deposition temperature profile versus alloy composition in an alloy graded layer.

In some embodiments, illustrated in FIG. 8, the deposition temperature 810 for an A-B alloy graded layer is increased for a portion of the graded layer containing low B content, up to a peak content 825, beyond which the deposition temperature is decreased. In further embodiments, for B contents greater than the peak content 825, the temperature is decreased at an increasing rate of decrease, with respect to the increasing B content. As shown in FIG. 8, the deposition temperature 810, beyond the intermediate content 820, decreases at the fastest rates as compared to the rates of decrease in other portions of the A-B alloy graded layer.

In further embodiments, the reactor employed to deposit the A-B alloy graded layer may impose limits upon the deposition temperature. For example, profile 811 represents a maximum temperature imposed by reactor limits, such as gas phase nucleation or other such constraints. In some embodiments, further limits on the deposition temperature may be due to alloy melting point limitations, as denoted by profile 812. In embodiments wherein these limits exist, the deposition temperature may be varied according to temperature profile 810 up to the B contents where the limits are reached, beyond which the temperature is varied according to profiles 811 or 812. For B contents beyond those limits, the temperature is once more varied according to profile 810, implying that the deposition temperature is decreased at an ever increasing rate of decrease beyond the intermediate content 820. Such deposition temperature profiles, as presented in FIG. 8, may be beneficial in instances where the A-B alloy yield stress, for B contents around 40-60% by composition, is substantially larger than the yield stress of pure A and pure B.

Figure 9:
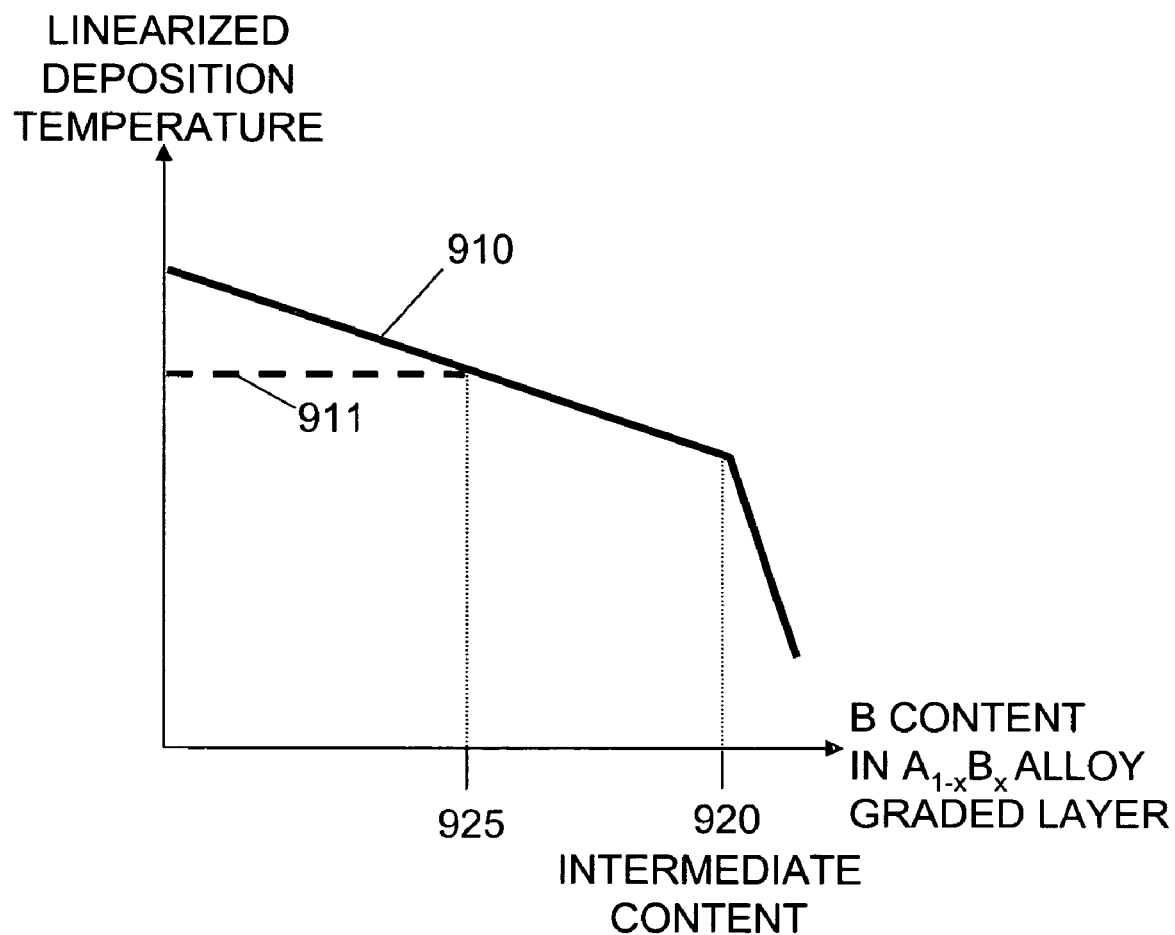
FIG. 9 is a graph of decreasing linearized deposition temperature profiles versus alloy composition in an alloy graded layer.

In some embodiments, the deposition temperature profile for the A-B alloy graded layer deposition process may be linearized as a function of the B content. As shown in FIG. 9, a linearized deposition temperature 910 is decreased at a first rate of decrease up to an intermediate content 920, and is decreased at a second rate of decrease, for B contents greater than the intermediate content 920. In some embodiments, the second rate of decrease, for B contents greater than the intermediate content 920, may be greater than the first rate of decrease, for B contents less than the intermediate content 920.

In one embodiment, the linearized deposition temperature profile may be such that the deposition temperature is constant for B contents less than a content 925, wherein content 925 is less than the intermediate content 920. As illustrated by curve 911 in FIG. 9, the linearized deposition temperature is constant up to content 925, beyond which the deposition temperature follows curve 910, as discussed above. In still further embodiments, the deposition temperature may be varied by any number of linear segments so as to create a desired deposition temperature profile as a function of B content variation along the deposition direction in the A-B alloy graded layer.

Figure 10:
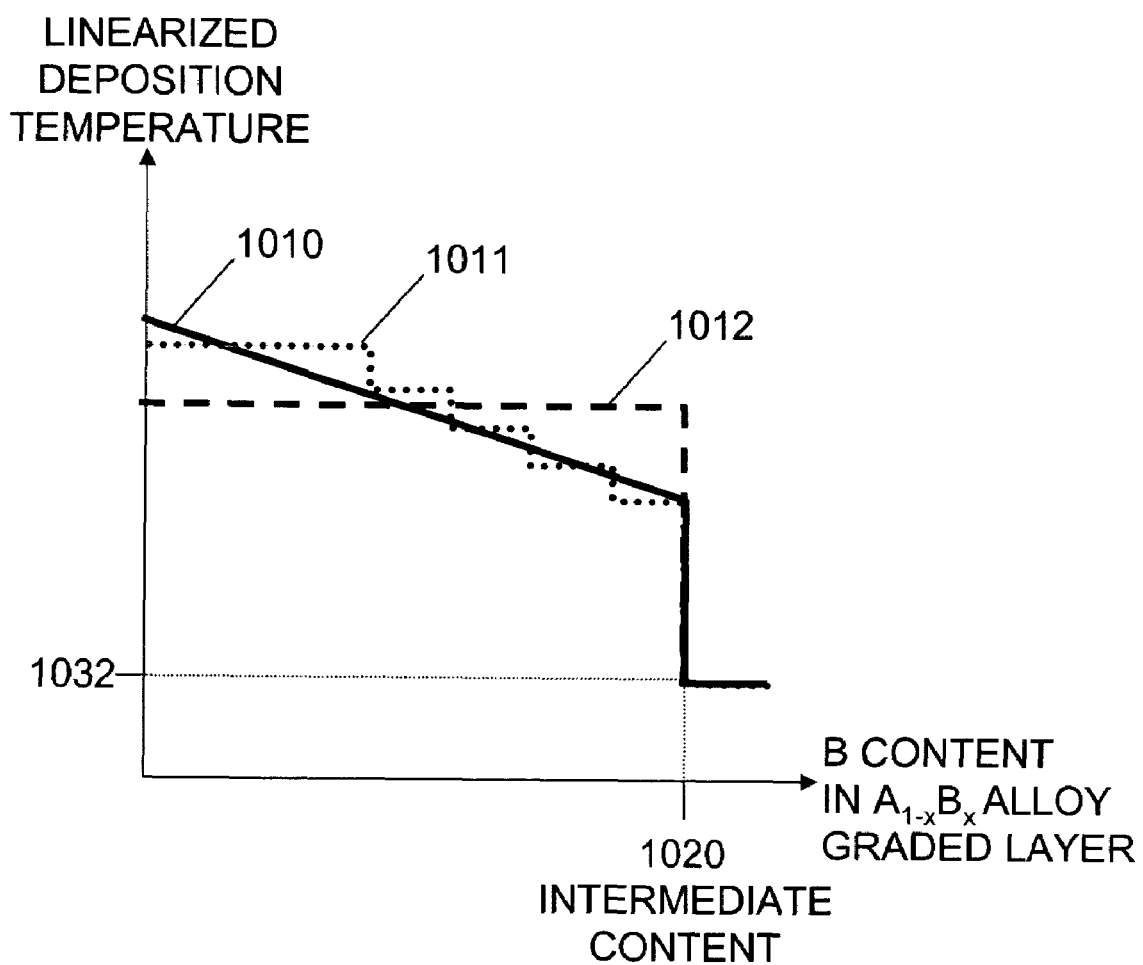
FIG. 10 is a graph of further linearized decreasing deposition temperature profiles versus alloy composition in an alloy graded layer.

In some embodiments, the deposition temperature profile may be linearized as shown in FIG. 10. In the embodiment illustrated by curve 1010, the deposition temperature decreases at a first rate of decrease for B contents less than the intermediate content 1020. At the intermediate content 1020, the deposition temperature is abruptly decreased to a lower temperature 1032 for the deposition of B contents greater than the intermediate content 1020. In one embodiment, illustrated by curve 1011, the deposition temperature variation for B contents less than the intermediate content 1020 consists of a number of step variations. In further embodiments, the deposition temperature may be constant, as shown by curve 1012, for B contents up to intermediate content 1020, beyond which the temperature is abruptly decreased to lower temperature 1032, and held constant for the deposition of the remainder of the A-B alloy graded layer possessing B contents greater than the intermediate content 1020. In some embodiments, the intermediate content 1020 may be chosen so as to minimize the threading dislocation density in the A-B alloy graded layer. For example, in the case of silicon germanium graded layers, the intermediate content may be 96% germanium by composition, and the final temperature 1032 may be less than about 700° C., and preferably about 550° C.

Figure 11:
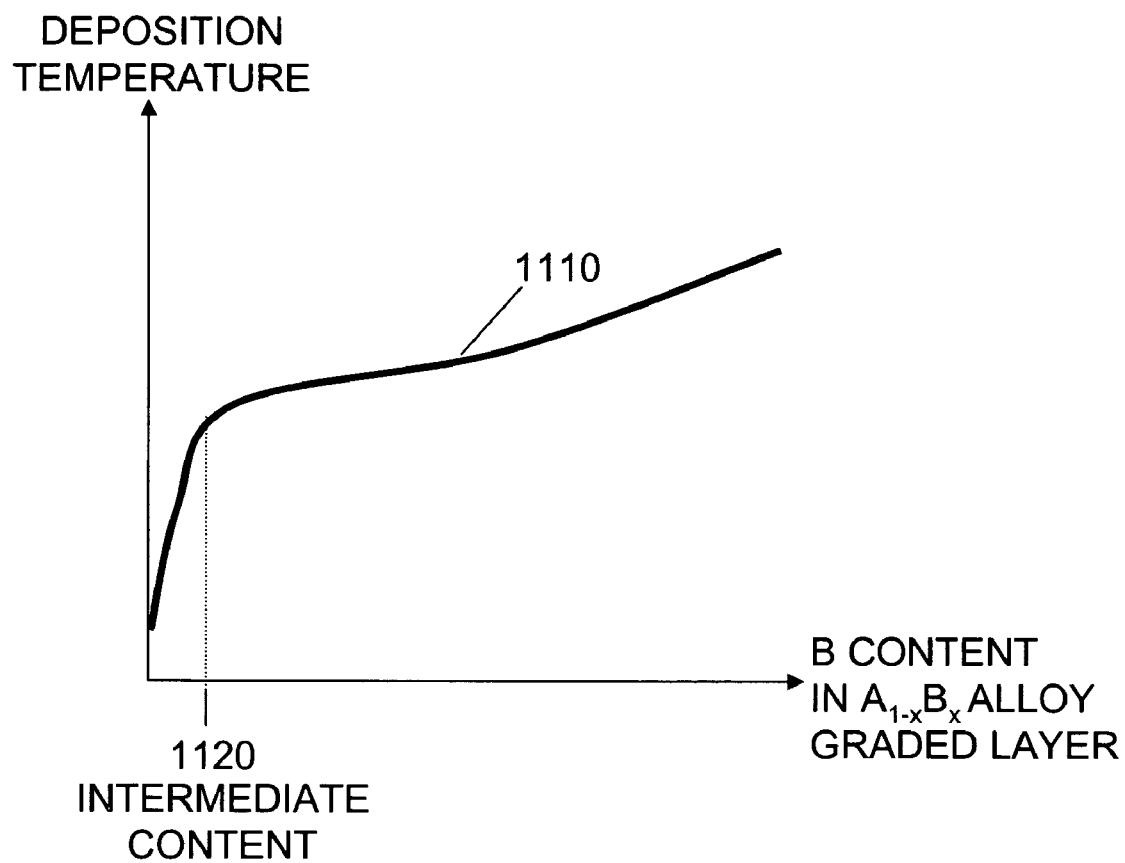
FIG. 11 is a graph of an increasing deposition temperature profile versus alloy composition in an alloy graded layer.

In some cases, for example when the pure A material is softer than the pure B material (as may be characterized by a lower yield stress) the threading dislocation density in an A-B alloy graded layer, with increasing B content, may benefit from an increasing deposition temperature, as illustrated in FIG. 11. In such embodiments, the deposition temperature is increased up to an intermediate content 1120, beyond which the rate(s) of increase are decreased, as illustrated by temperature profile 1110. In cases where the pure A material is softer than the pure B material, as is typically the case when the pure A constituent has a larger lattice constant than the pure B constituent, the intermediate content is usually less than about 20% B and preferably about 5% B.

An example of an instance where this deposition temperature variation may be of benefit is silicon germanium graded layers with increasing silicon content, deposited on substrates comprising a pure germanium surface. In such an example, the initial silicon content in the graded layer is 0% and is increased along the deposition direction during the deposition process of the graded layer. Also, the deposition temperature might be increased until an intermediate silicon content of about 4% is reached, beyond which the rate(s) of increase of the deposition temperature, with respect to increasing silicon content, may be decreased for the remainder of the silicon germanium graded layer deposition process.

Figure 12:
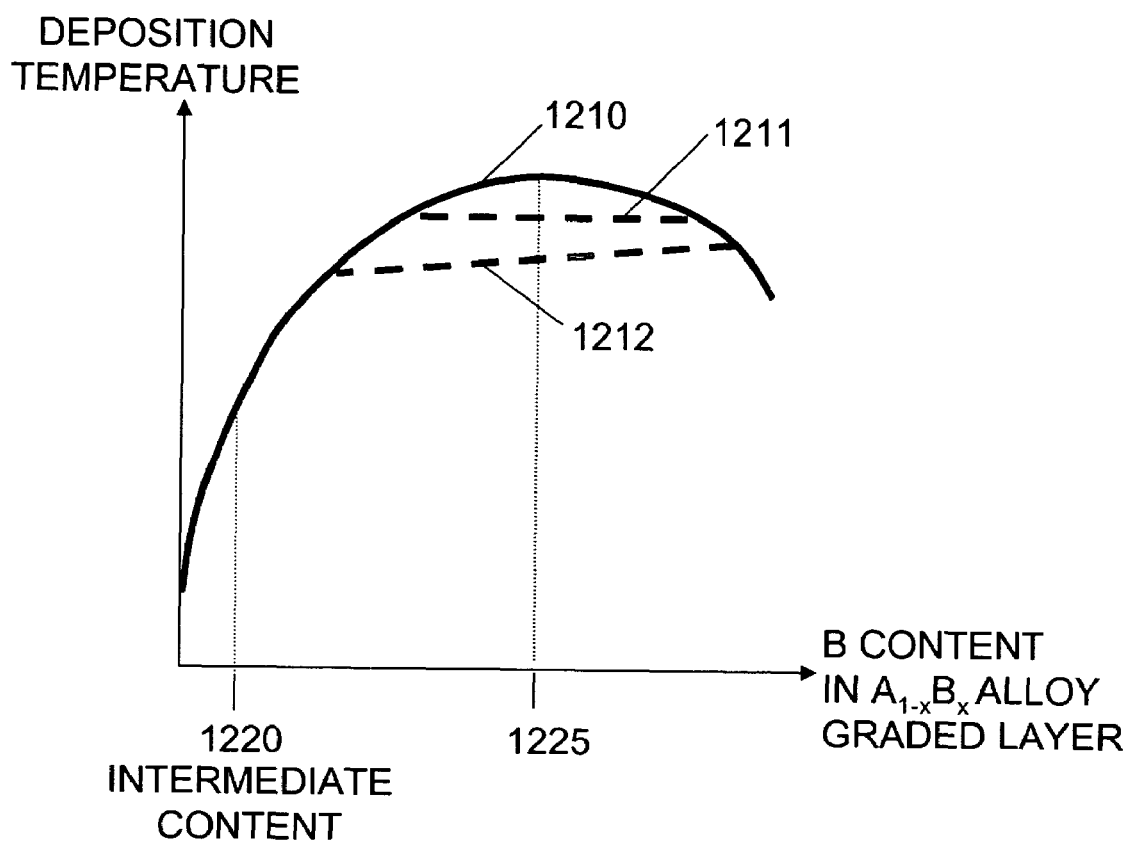
FIG. 12 is a graph of another deposition temperature profile versus alloy composition in an alloy graded layer.

In some embodiments, illustrated in FIG. 12, the deposition temperature 1210 for an A-B alloy graded layer is increased for a portion of the graded layer containing low B content, up to a peak content 1225, beyond which the deposition temperature is decreased. In further embodiments, the deposition temperature 1210, up to an intermediate content 1220, increases at faster rates as compared to the rates of increase in other portions of the A-B alloy graded layer.

In further embodiments, the reactor employed to deposit the A-B alloy graded layer may impose limits upon the deposition temperature. For example, temperature profile 1211 represents a maximum temperature imposed by reactor limits, such as gas phase nucleation or other such constraints. In some embodiments, further limits on the deposition temperature may be due to alloy melting point limitations, as denoted by profile 1212. In embodiments where these limits exist, the deposition temperature may be varied according to temperature profile 1210 up to the B contents where the limits are reached, beyond which the temperature is varied according to profiles 1211 or 1212. For B contents beyond those limits, the temperature is once more varied according to temperature profile 1210. Such deposition temperature profiles, as presented in FIG. 12, may be beneficial in instances where the A-B alloy yield stress, for B contents around 40-60% by composition, is substantially larger than the yield stress of pure A and pure B.

Figure 13:
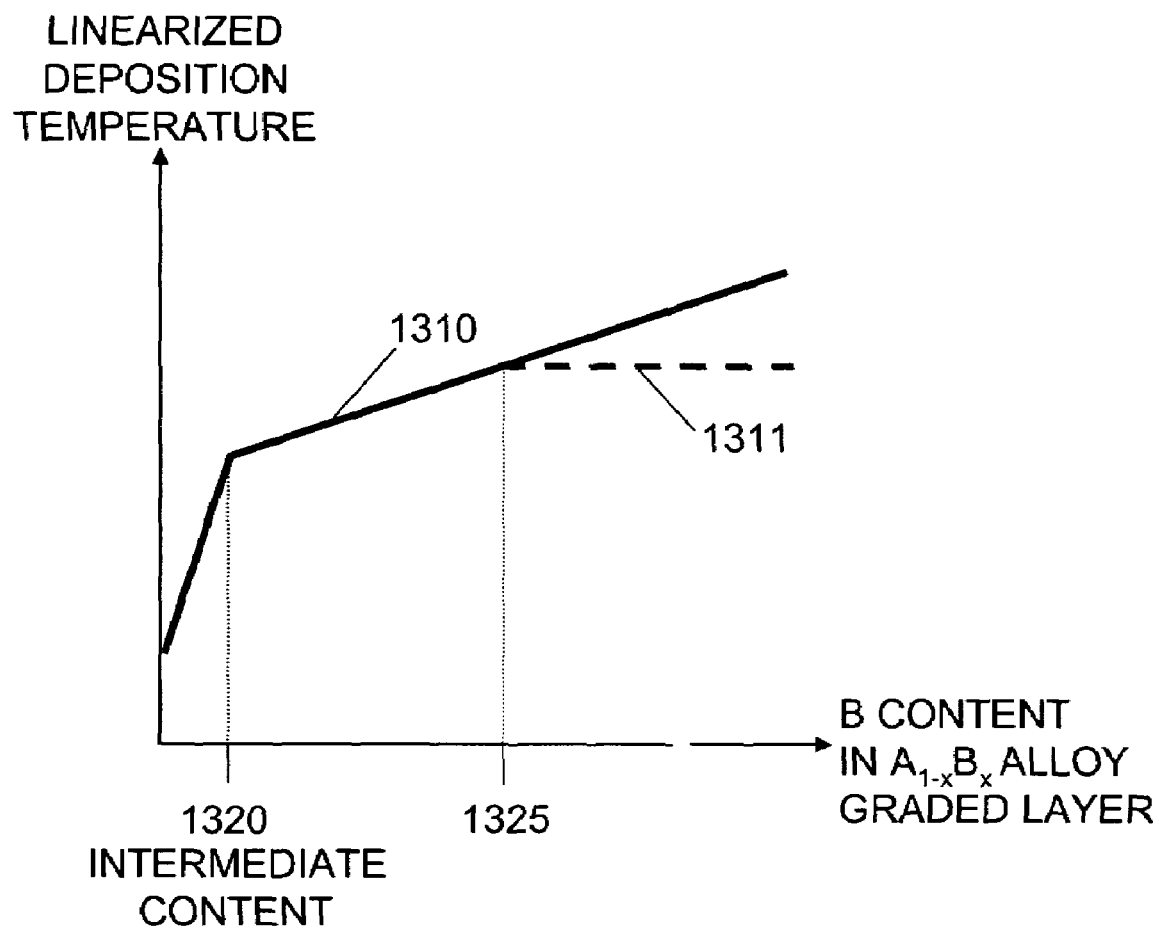
FIG. 13 is a graph of increasing linearized deposition temperature profiles versus alloy composition in an alloy graded layer.

In some embodiments, the deposition temperature profile for the A-B alloy graded layer may be linearized as a function of the B content, so as to facilitate the deposition process. As shown in FIG. 13, a linearized deposition temperature 1310 is increased at a first rate up to an intermediate content 1320, and increased at a second rate, for B contents greater than the intermediate content 1320. In some embodiments, the first rate of increase, for B contents less than the intermediate content 1320, may be greater than the second rate of increase, for B contents greater than the intermediate content 1320.

In further embodiments, the linearized deposition temperature may be chosen so that the temperature is constant for B contents greater than a content 1325, wherein content 1325 is greater than the intermediate content 1320. As illustrated by profile 1311 in FIG. 13, this linearized deposition temperature follows profile 1310 up to content 1325, beyond which the deposition temperature is held constant. In still further embodiments, the deposition temperature may be varied by any number of linear segments so as to create a desired deposition temperature profile as a function of B content variation along the deposition direction in the A-B alloy graded layer.

Figure 14:
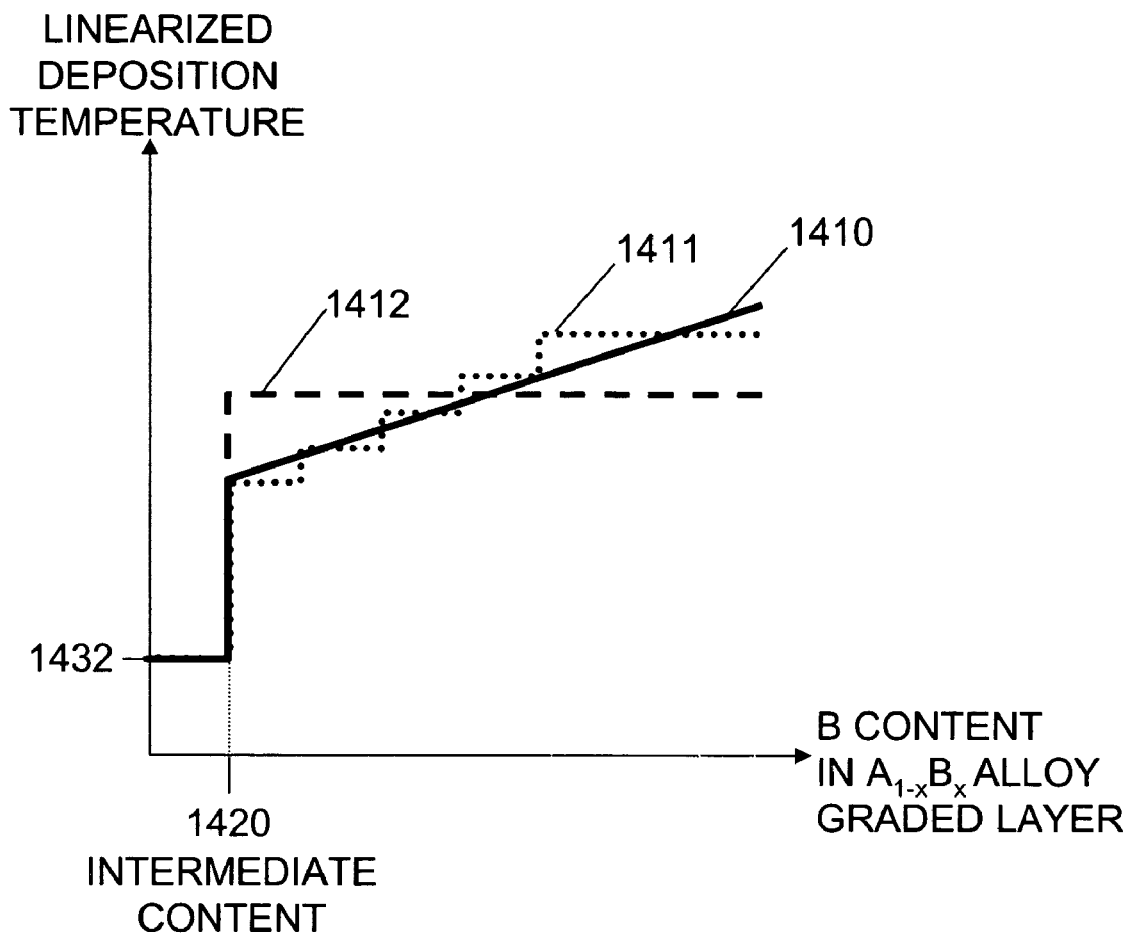
FIG. 14 is a graph of further linearized increasing deposition temperature profiles versus alloy composition in an alloy graded layer.

In some embodiments, the deposition temperature may be linearized as shown in FIG. 14. In the embodiment illustrated by profile 1410, the deposition temperature is held constant at a low temperature 1432, for B contents up to the intermediate content 1420. At the intermediate content 1420, the temperature is abruptly increased in a step-fashion, beyond which the deposition temperature proceeds to increase for B contents greater than the intermediate content 1420. In one embodiment, illustrated by profile 1411, the deposition temperature for B contents greater than the intermediate content 1420 consists of a number of step variations. In further simpler embodiments the deposition temperature may be held constant for B contents up to the intermediate content 1420, beyond which the temperature is abruptly increased, and held constant, according to profile 1412, for the deposition of the remainder of the A-B alloy graded layer. In some embodiments, the intermediate content 1420 may be chosen so as to minimize the threading dislocation density in the A-B alloy graded layer. For example, in the case of silicon germanium graded layers, the intermediate content may be 4% silicon, and the temperature 1432 may be less than about 700° C., and preferably about 550° C.

Figure 15:
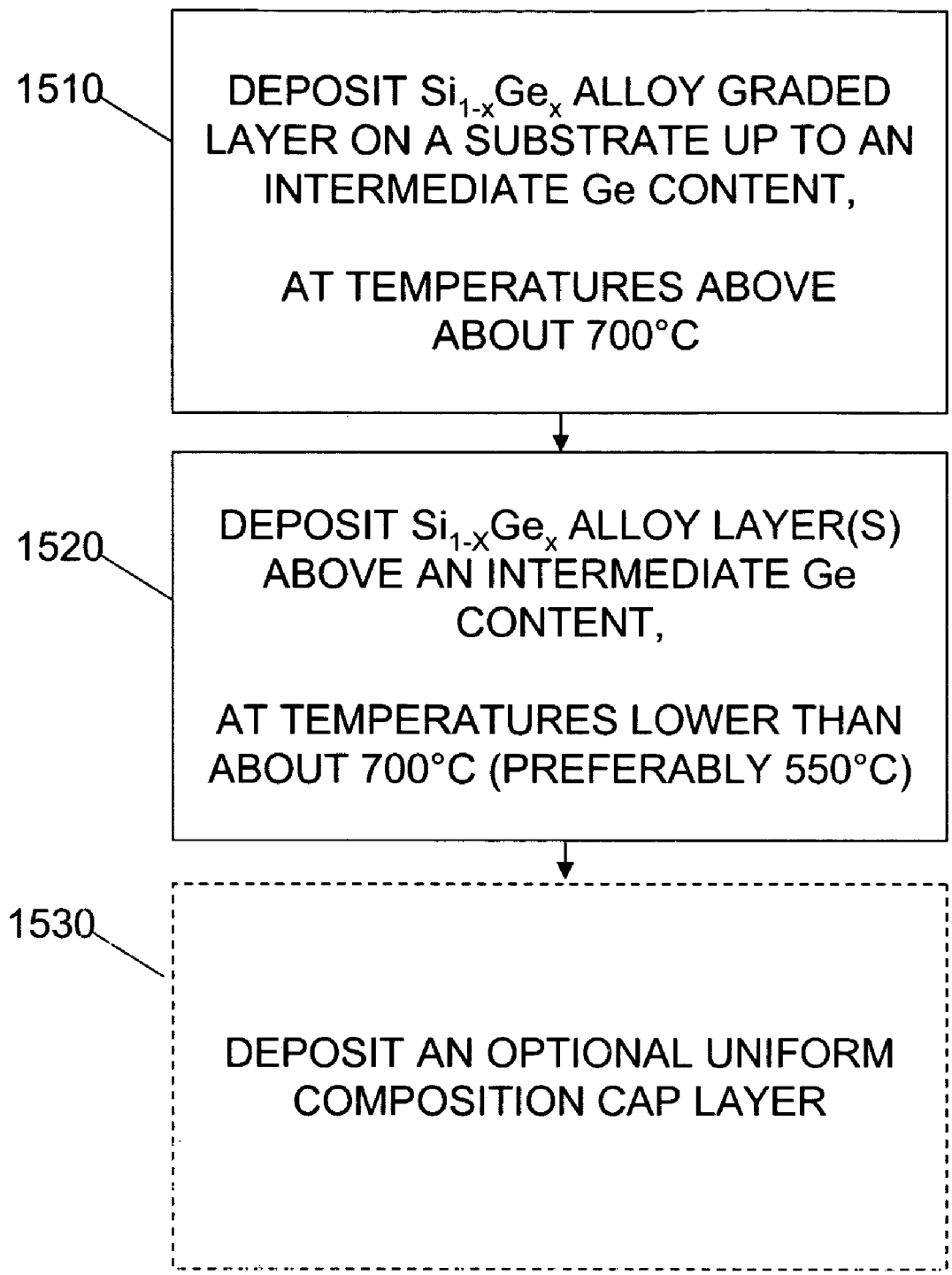
FIG. 15 is a flowchart illustrating a method for making silicon germanium graded layers.

In some embodiments involving silicon germanium graded layers, with increasing germanium content, the deposition process may proceed via steps illustrated in FIG. 15. A substrate is first provided, and may comprise an on-cut or off-cut substrate. In some embodiments, the off-cut substrate may possess a low off-cut angle, for example an off-cut angle less than about 4°, preferably about 2°. A first silicon germanium graded layer is deposited on a substrate at temperatures above about 700° C., with germanium content up to an intermediate content, as noted in step 1510. The intermediate content is in a range of about 92% to 99% germanium by composition, preferably about 96% germanium by composition. Next, silicon germanium alloy layers with germanium contents greater than the intermediate content are deposited over the silicon germanium graded layer possessing germanium contents less than the intermediate content, at temperatures lower than about 700° C., and preferably about 550° C., as illustrated by step 1520. In further embodiments, the silicon germanium alloy layers with germanium contents greater than the intermediate content may comprise a second silicon germanium graded layer with germanium contents greater the intermediate content. Also, an additional uniform composition cap layer may be deposited over the resulting structure, as noted by step 1530. Deposition temperatures lower than about 700° C. for the deposition of layers with greater than about 96% germanium may allow for the reduction of the threading dislocation density in the silicon germanium alloy graded layer.

Figure 16:
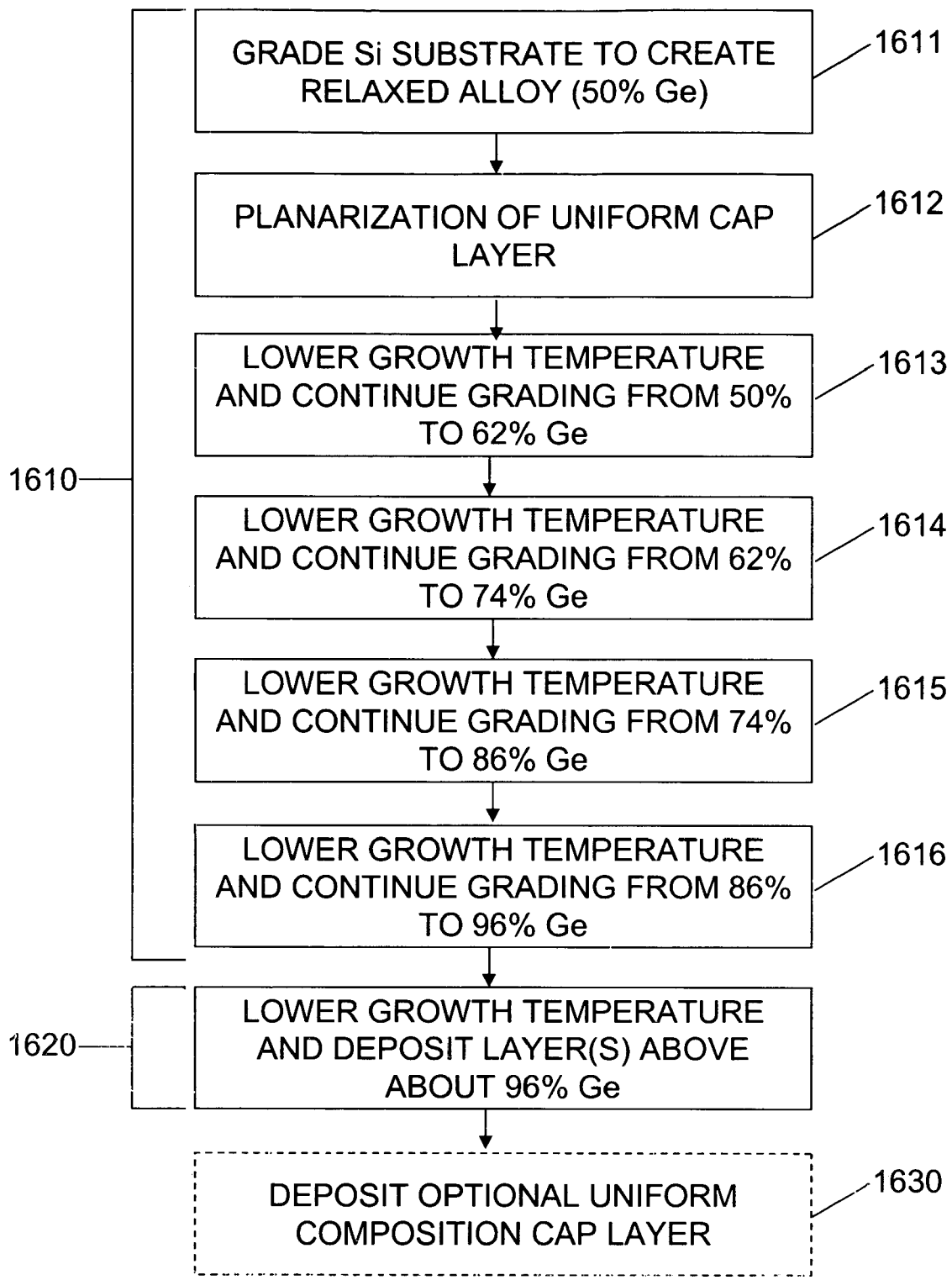
FIG. 16 is a flowchart illustrating a further method for making a silicon germanium graded layer.

FIG. 16 illustrates a further embodiment comprising the deposition of a first structure with germanium contents less than an intermediate content of about 96% germanium, as denoted by 1610, and the deposition of silicon germanium layers with germanium content greater than the intermediate content of about 96% germanium, as noted in step 1620.

The deposition of the first structure, as denoted by steps 1610, further comprises grading a silicon germanium alloy layer up to about 50% germanium, as denoted by step 1611. The silicon germanium graded layer is preferably graded at a rate of 10% Ge $\mu m^{-1}$ up to the 50% germanium content. The surface of this layer may be capped with a uniform 50% germanium layer, which typically has a thickness of about 1 $\mu m$ to about 3 $\mu m$, preferably about 2 $\mu m$. The graded silicon germanium structure is then planarized, as noted in step 1612. For example, the planarization may be accomplished using an ex-situ chemical mechanical polishing step, or any other suitable technique. Preferably, the planarized 50% germanium graded layer surface has threading dislocation density of less than about $1 \times 10^6$ cm$^{-2}$, and preferably about $5 \times 10^5$ cm$^{-2}$.

The structure comprising the planarized surface is then placed back into the deposition chamber, the deposition temperature is lowered, and the grading of the silicon germanium graded layer continues from about 50% to about 62% germanium, as illustrated in step 1613. The temperature is then lowered again and the grading continues from about 62% germanium to about 74% germanium, as illustrated in step 1614. The deposition temperature is then lowered once more and the grading continues from about 74% to about 86% germanium, as illustrated in step 1615. The deposition temperature is once again lowered and the grading continues from about 86% germanium to about 96% germanium, as noted in step 1616. Next, the deposition temperature is lowered to a final temperature for the deposition of layers containing germanium contents greater than about 96%, as illustrated in step 1620. Preferably, the grading of the silicon germanium graded layers is about 10% Ge $\mu m^{-1}$.

Optionally, a uniform composition cap layer may then be deposited over the structure, as illustrated in step 1630. The thickness of the uniform composition cap layer is in the range of about 0.5 $\mu m$ to about 2 $\mu m$, and preferably has a thickness of about 1 $\mu m$. In some cases, the uniform composition cap layer may comprise a pure germanium uniform layer. In further embodiments, the uniform composition cap layer may comprise any silicon germanium alloy layer with a germanium content greater than about 96%.

Figure 17:
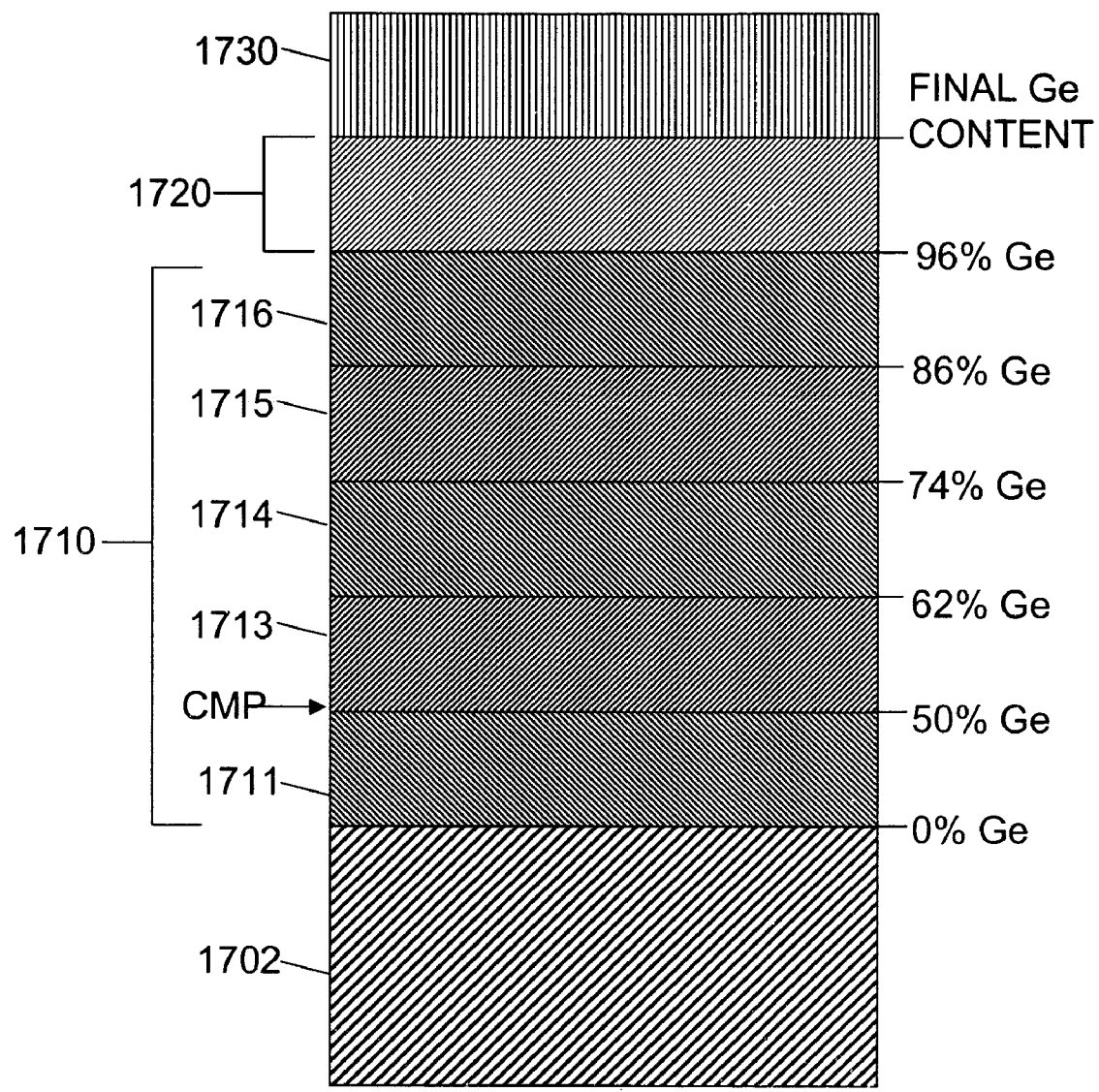
FIG. 17 is a schematic illustration of a silicon germanium graded layer, made in accordance with the method of FIG. 16.

FIG. 17 illustrates the structure created using the method outlined in FIG. 16. The structure comprises a substrate 1702, which may comprise an on-cut or off-cut substrate. In some embodiments, the off-cut substrate may possess a low off-cut angle, for example an off-cut angle less than about 4°, preferably about 2°. A first silicon germanium graded layer 1710 is disposed over the substrate 1702. The first silicon germanium graded layer 1710 comprises a number of regions deposited at varying temperatures. Specifically, region 1711 comprises a graded layer from 0% germanium to about 50% germanium, deposited at a first temperature. The surface of graded layer 1711 may optionally be planarized, for example, using a chemical mechanical polishing (CMP) step. The region 1713 comprises silicon germanium with increasing germanium content from about 50% to about 62% germanium, deposited at a second temperature. The region 1714 contains silicon germanium with increasing germanium content from about 62% to about 74%, deposited at a third temperature. The region 1715 contains silicon germanium with increasing germanium content from about 74% to about 86% germanium, deposited at a fourth temperature. Region 1716 contains silicon germanium with increasing germanium content from about 86% to about 96% germanium, deposited at a fifth temperature. It will be appreciated by those of skill in the art that the initiation of all grading layers at different temperatures is initiated by first growing a lattice-matched uniform composition layer before grading is initiated.

Layers with germanium contents greater than about 96% germanium, deposited at lower temperatures, are disposed over the first silicon germanium graded layer 1710. In some embodiments, layer 1720 may comprise a silicon germanium graded layer with increasing germanium content from about 96% to a final germanium content. In further embodiments, layer 1720 may comprise any number of silicon germanium uniform composition layers with germanium contents greater than about 96% germanium. In some embodiments, the final germanium content may comprise 100% germanium, namely a pure germanium layer. Optionally, a uniform composition cap layer 1730 may be disposed over layer 1720.

Figure 18:
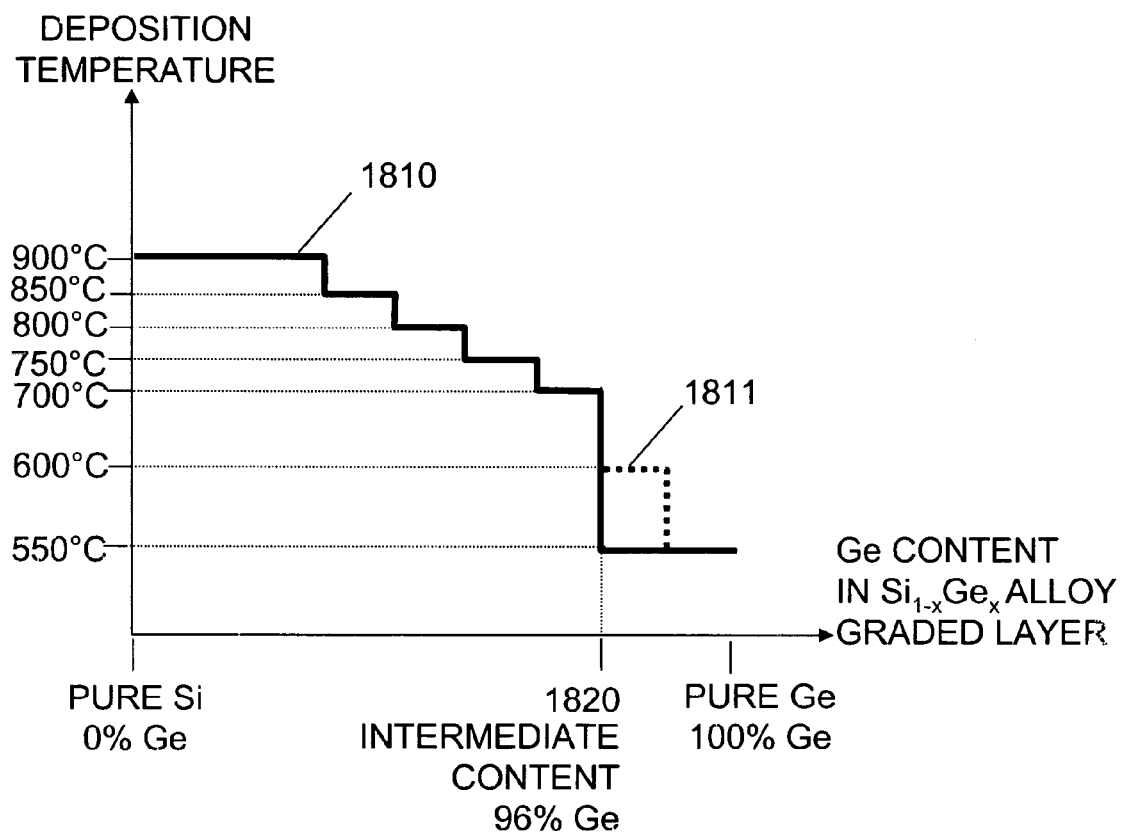
FIG. 18 is a graph of a deposition temperature profile versus germanium content in a silicon germanium graded layer, in accordance with the method of FIG. 16.

In some embodiments, the deposition temperature may be varied in a step-wise fashion as shown by FIG. 18, which may be in accordance with the method presented in FIGS. 16 and 17, but need not be limited to these embodiments. As the germanium content in the graded layer is increased, the deposition temperature 1810 is decreased in increments of 50° C. At an intermediate content, preferably about 96% germanium, the deposition temperature is decreased from about 700° C. to about 550° C. The remainder of the deposition, for portions of the graded layer with germanium contents greater than about 96% germanium, proceeds at temperatures of about 550° C. In some embodiments, the deposition temperature at the intermediate content may be decreased by a smaller amount as illustrated by profile 1811. For example, the deposition temperature might be decreased from about 700° C. to about 600° C., and after a further increase in germanium content beyond about 96% germanium, the deposition temperature may again be decreased from about 600° C. to about 550° C.

In some embodiments, the abrupt temperature transition, at the intermediate germanium content, may allow for a minimization of the threading dislocation density in the silicon germanium graded layer. For example, the threading dislocation density for substantially relaxed germanium on silicon substrates, deposited via the above-mentioned embodiment, may be lower that about $1 \times 10^6$ cm$^{-2}$, and is typically between about $5 \times 10^6$ cm$^{-2}$ and about $1 \times 10^6$ cm$^{-2}$ Note that in most cases, "substantial" relaxation may typically mean more than about 80% relaxation, with only residual strain remaining in the deposited layer.

Figure 19:
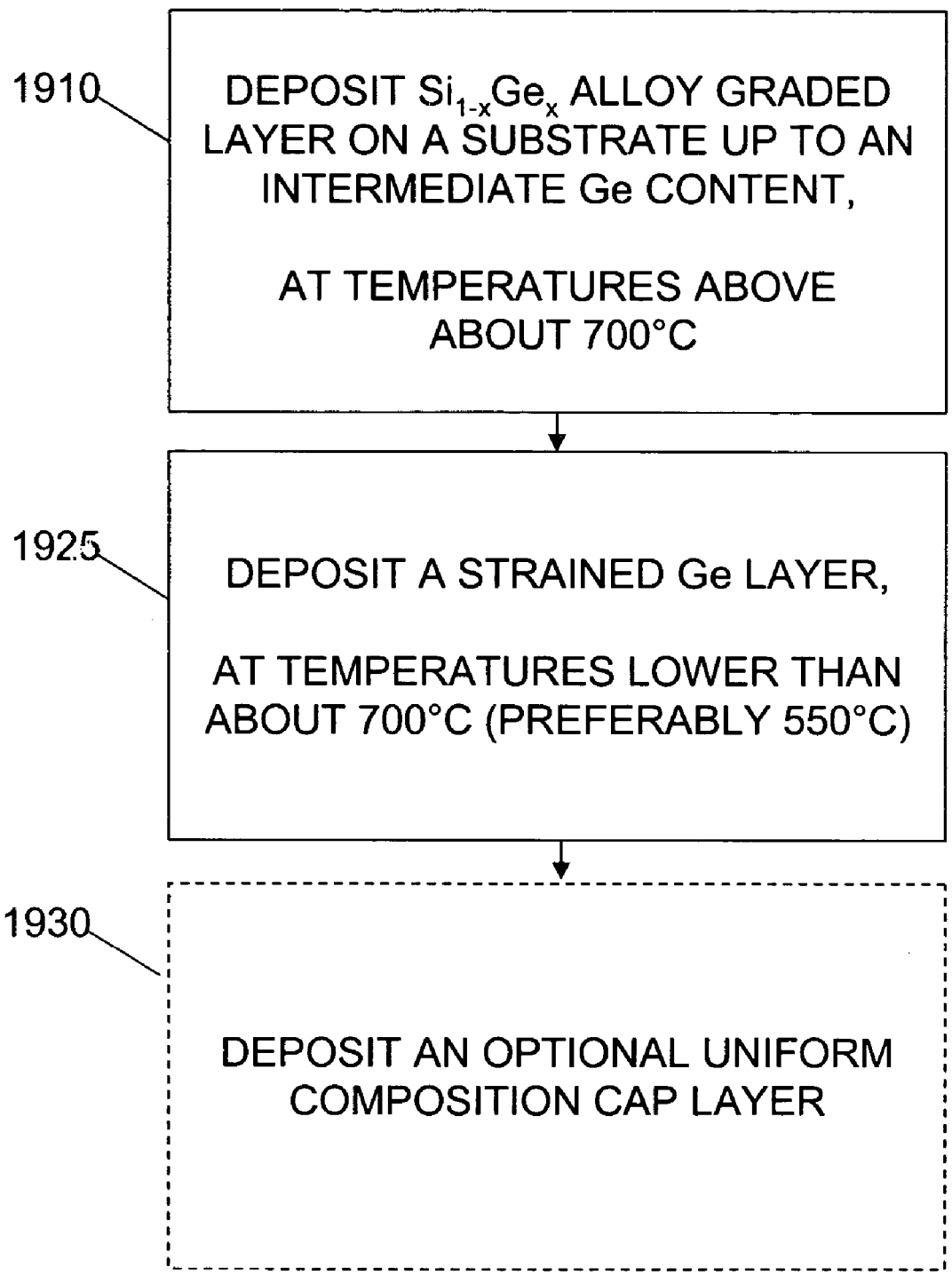
FIG. 19 is a flowchart illustrating a method for making a strained germanium layer disposed over a silicon germanium graded layer.

In further embodiments involving silicon germanium graded layers, with increasing germanium content, the deposition process may proceed via steps illustrated in FIG. 19. A substrate is first provided, which may comprise an on-cut or off-cut substrate. In some embodiments, the off-cut substrate may possess a low off-cut angle, for example an off-cut angle less than about 4°, preferably about 2°. A silicon germanium graded layer is deposited on the substrate at temperatures above about 700° C., with germanium content up to an intermediate content, as noted in step 1910. The intermediate content may be in a range of about 92% to about 99% germanium by composition, preferably about 96% germanium by composition. Next, a strained germanium layer is deposited over the silicon germanium graded layer, at temperatures lower than about 700° C., and preferably between about 350° C. and 550° C., as illustrated by step 1925. The thickness of the strained germanium layer is in the range of about 5 nm to about 200 nm, and preferably has a thickness of about 50 nm. Such a structure has the benefit that its surface properties may be essentially identical to relaxed germanium, yet dislocation nucleation in this layer is circumvented by keeping its thickness at or below the critical thickness. Additionally, an optional uniform composition cap layer may be deposited over the resulting structure, as noted by step 1930. For example, the uniform composition cap layer may comprise a semiconductor, including a silicon germanium alloy, a III-V compound or alloy, or a II-VI compound or alloy. Examples of III-V compounds or alloys may include gallium arsenide, aluminum gallium arsenide, gallium phosphide, indium gallium phosphide, indium phosphide, and indium gallium arsenide. In one embodiment, the uniform composition cap layer comprises gallium arsenide. The gallium arsenide may possess minimal threading dislocation due to the gallium arsenide possessing a lattice constant that is almost equal to the lattice constant of the strained germanium layer.

Figure 20:
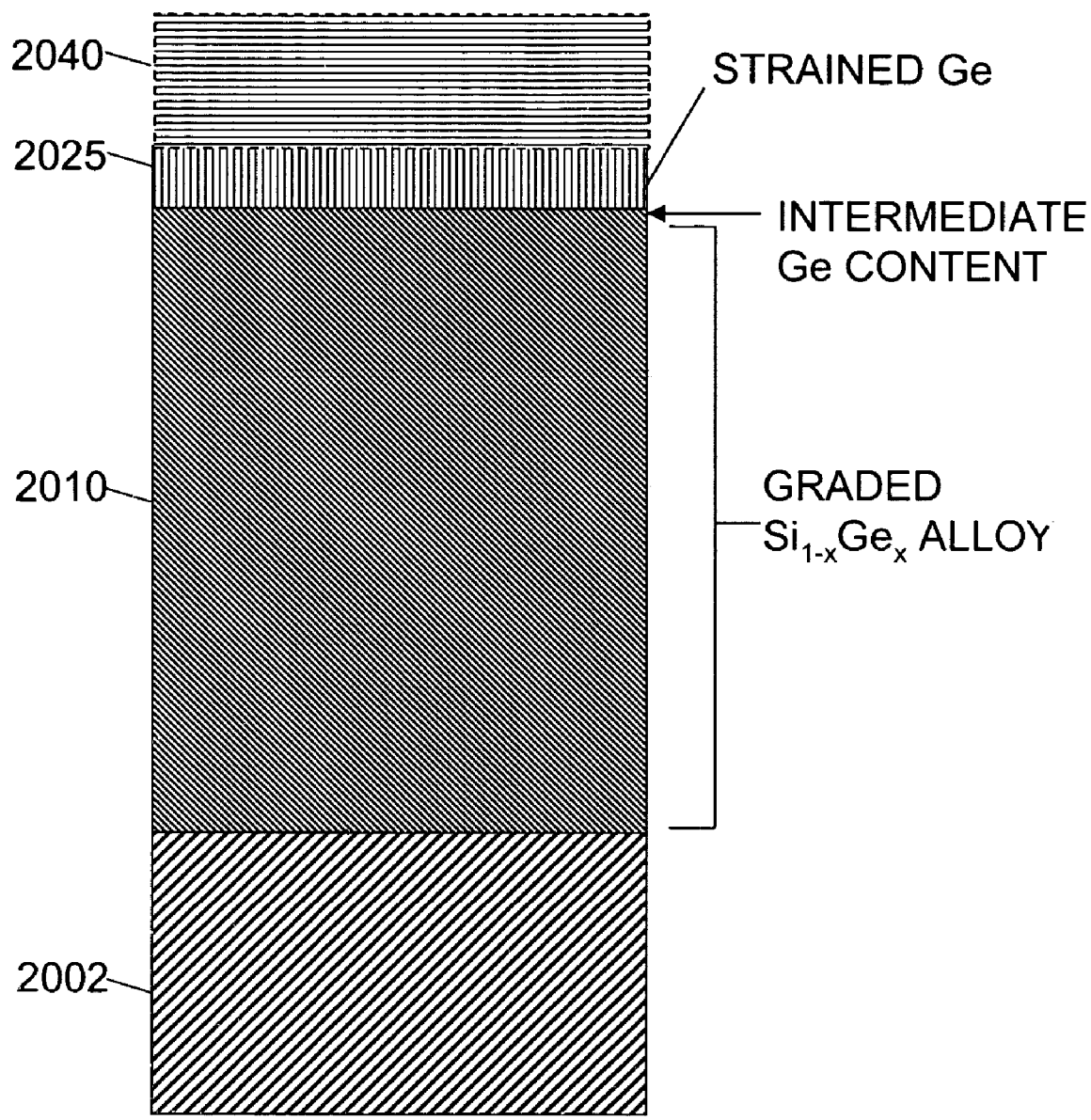
FIG. 20 is a schematic illustration of a strained germanium layer disposed over a silicon germanium graded layer, made in accordance with the method of FIG. 19.

FIG. 20 illustrates the structure created using the method outlined in FIG. 19. The structure comprises a substrate 2002, which may comprise an on-cut or off-cut substrate. In some embodiments, the off-cut substrate may possess a low off-cut angle, for example an off-cut angle less than about 4°, preferably about 2°. A first silicon germanium graded layer 2010 is disposed over the substrate 2002. The silicon germanium graded layer 2010 may comprise a number of regions deposited at varying temperatures, but may also be deposited at a constant temperature. The germanium content in the silicon germanium graded layer 2010 may increase along the deposition direction, starting from about 0% germanium up to an intermediate germanium content. The intermediate germanium content may be in a range of about 92% to about 99% germanium by composition, preferably about 96% germanium by composition. A strained germanium layer 2025 is disposed over the silicon germanium graded layer 2010. The thickness of the strained germanium layer 2025 is in the range of about 5 nm to about 200 nm, and preferably has a thickness of about 50 nm. In some embodiments, the thickness of the strained germanium layer 2025 may be less than the critical thickness required to nucleate dislocations, therefore the strained germanium layer 2025 may be almost fully strained. In further embodiments, an optional uniform composition cap layer 2040 may be disposed over the strained germanium layer 2025. For example, the uniform composition cap layer 2040 may comprise a semiconductor, including a silicon germanium alloy, a III-V compound or alloy, or a II-VI compound or alloy. Examples of III-V compounds or alloys may include gallium arsenide, aluminum gallium arsenide, gallium phosphide, indium gallium phosphide, indium phosphide, and indium gallium arsenide. In one embodiment, the uniform composition cap layer 2040 comprises gallium arsenide. The gallium arsenide may possess minimal threading dislocation due to the gallium arsenide possessing a lattice constant that is almost equal to the lattice constant of the strained germanium layer.

In the embodiments presented, the graded layers need not be doped to achieve low threading dislocation density, but doping could be incorporated if desired. This is in contrast to some other methods for reducing threading dislocation density in graded layers which specifically require antimony doping in the graded layers to increase dislocation mobility and lower threading dislocation density. For example, in the case of silicon germanium, one such approach requires that the relaxed silicon germanium graded layer is doped with antimony concentrations greater than about $10^{16}$ cm$^{-3}$.

Is should be appreciated that the numerous embodiments herein are described by referring to rates of decrease and rates of increase of temperature profiles, in accordance with a variation of increasing B content. Generically, such variations may be referred to as signed rates of change, wherein a signed rate of change of a decreasing temperature profile is negative and a signed rate of change of an increasing temperature profile is positive. Moreover, the signed rate of change for a constant temperature profile is zero.

Hence, when comparing signed rates of change, the signs must be taken into account. In contrast, rates of decrease and rates of increase both refer to magnitudes, and hence are positive quantities. As such, the signed rate of change of a decreasing temperature profile is less than the signed rate of change of an increasing temperature profile. Also, a temperature profile possessing an increasing rate of decrease corresponds to a decreasing signed rate of change. In addition, a temperature profile possessing a decreasing rate of increase also corresponds to a decreasing signed rate of change.

Furthermore, the minimum and maximum signed rates of change of a temperature profile include the sign of the signed rate of change. Therefore, in regards to a decreasing temperature profile, the minimum signed rate of change corresponds to the largest rate of decrease, whereas the maximum signed rate of change corresponds to the smallest rate of decrease. In contrast, with regards to an increasing temperature profile, the minimum signed rate of change corresponds to smallest rate of increase, whereas the maximum signed rate of change corresponds to the largest rate of increase.

It should be appreciated that the embodiments described herein may be implemented individually, and additionally, any number of embodiments, or aspects of embodiments, may be combined to create further embodiments that are intended to be within the scope of the invention.

Having thus described several aspects of numerous embodiments, it is to be appreciated that various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are presented by way of example only and the invention is limited only as required by the appended claims.

The invention claimed is:

1. A method of forming a semiconductor structure, comprising:
depositing a first structure over a substrate, wherein the entire first structure is deposited at a temperature greater than about 700° C., wherein the first structure comprises a substantially relaxed silicon germanium graded layer having a surface comprising a germanium content greater than about 92% by composition; and
depositing a second structure over the first structure, at a temperature less than about 700° C., wherein the second structure comprises a semiconductor having a germanium content greater than about 92% by composition.

2. The method of claim 1, wherein depositing a second structure comprises depositing one or more substantially relaxed silicon germanium layers having germanium contents greater than about 92% by composition.

3. The method of claim 2, wherein the substrate comprises an off-cut substrate with an off-cut angle from a nearest direction of less than about 4°.

4. The method of claim 3, wherein depositing the second structure over the first structure comprises depositing one or more substantially relaxed silicon germanium layers with germanium contents greater than about 96% by composition, at temperatures less than about 700° C.

5. The method of claim 3, wherein depositing the second structure over the first structure comprises depositing one or more substantially relaxed silicon germanium layers with germanium contents greater than about 96% by composition, at a temperature of about 550° C.

6. The method of claim 2, wherein the substrate comprises an off-cut substrate with an off-cut angle from a nearest direction of about 2°.

7. The method of claim 2, wherein depositing the first structure comprises depositing one or more substantially relaxed silicon germanium layers with germanium contents less than about 50% by composition, at temperatures greater than about 850° C.

8. The method of claim 2, wherein depositing the first structure comprises depositing one or more substantially relaxed silicon germanium layers with germanium contents greater than about 50% by composition and less than about 96% by composition, at temperatures greater than about 700° C.

9. The method of claim 2, wherein depositing the second structure over the first structure comprises depositing one or more substantially relaxed silicon germanium layers with germanium contents greater than about 96% by composition, at temperatures less than about 700° C.

10. The method of claim 9, wherein the depositing the second structure over the first structure comprises depositing one or more substantially relaxed silicon germanium layers with germanium contents greater than about 96% by composition, at a temperature of about 550° C.

11. The method of claim 1, wherein depositing the second structure comprises depositing a strained germanium layer.

12. The method of claim 11, wherein the surface of the substantially relaxed silicon germanium graded layer comprises a germanium content of about 96% by composition.

13. The method of claim 11, wherein depositing the substantially relaxed silicon germanium graded layer over the substrate, at temperatures greater than about 700° C., comprises varying the deposition temperature.

14. The method of claim 11, wherein the strained germanium layer possesses a threading dislocation density less than about $1 \times 10^6$ cm$^{-2}$.

15. The method of claim 11, wherein the substrate comprises an off-cut substrate with an off-cut angle from a nearest direction of less than about 4°.

16. The method of claim 11, wherein the substrate comprises an off-cut substrate with an off-cut angle from a nearest direction of about 2°.

17. The method of claim 11, wherein depositing the strained germanium layer comprises depositing the strained germanium layer over the substantially relaxed silicon germanium graded layer at a temperature less than about 550° C.

* * * * *

UNITED STATES PATENT AND TRADEMARK OFFICE
CERTIFICATE OF CORRECTION

PATENT NO. : 7,682,952 B2  Page 1 of 1
APPLICATION NO. : 10/999486
DATED : March 23, 2010
INVENTOR(S) : David Michael Isaacson et al.

It is certified that error appears in the above-identified patent and that said Letters Patent is hereby corrected as shown below:

In the Claims:

At column 15, claim 3, line 2, please replace "nearest" with -- nearest [100] --;

At column 15, claim 6, line 15, please replace "nearest" with -- nearest [100] --;

At column 16, claim 15, line 21, please replace "nearest" with -- nearest [100] --;

At column 16, claim 16, line 24, please replace "nearest" with -- nearest [100] --.

Signed and Sealed this

Eleventh Day of May, 2010

David J. Kappos
*Director of the United States Patent and Trademark Office*